United States Patent
Shindo et al.

[11] Patent Number: 6,109,278
[45] Date of Patent: Aug. 29, 2000

[54] LIQUID TREATMENT METHOD AND APPARATUS

[75] Inventors: Naoki Shindo, Nirasaki; Miyako Yamasaka, Nagasaka-cho; Yuji Kamikawa, Koshi-machi, all of Japan

[73] Assignee: Tokyo Electron Limited, Tokyo-To, Japan

[21] Appl. No.: 09/317,116

[22] Filed: May 24, 1999

Related U.S. Application Data

[62] Division of application No. 08/911,353, Aug. 7, 1997, Pat. No. 5,922,138.

[30] Foreign Application Priority Data

Aug. 12, 1996 [JP] Japan .................................. 8-227362
Aug. 12, 1996 [JP] Japan .................................. 8-227363

[51] Int. Cl.[7] .................................................... B08B 3/04
[52] U.S. Cl. ................. 134/56 R; 134/95.2; 134/95.3; 134/98.1; 134/100.1; 134/102.1; 134/104.1; 134/902
[58] Field of Search ................. 134/94.1, 902, 134/95.3, 102.1, 56 R, 57 R, 95.1, 95.2, 98.1, 100.1, 104.1

[56] References Cited

U.S. PATENT DOCUMENTS

| | | | |
|---|---|---|---|
| 3,066,050 | 11/1962 | Garton | 134/2 |
| 3,188,238 | 6/1965 | Lyon | 134/24 |
| 4,197,000 | 4/1980 | Blackwood | 134/95.2 X |
| 4,409,999 | 10/1983 | Pedziwiatr | 134/95.2 |
| 4,967,777 | 11/1990 | Takayama et al. | 134/102 |
| 4,976,810 | 12/1990 | Masuda et al. | 156/659.1 |
| 5,063,949 | 11/1991 | Yates | 134/60 |
| 5,275,184 | 1/1994 | Nishizawa et al. | 134/57 R |
| 5,315,793 | 5/1994 | Peterson et al. | 51/415 |
| 5,361,789 | 11/1994 | Yoshida et al. | 134/68 |
| 5,409,418 | 4/1995 | Krone-Schmidt et al. | 451/75 |
| 5,415,191 | 5/1995 | Mashimo et al. | 134/102.1 |
| 5,540,247 | 7/1996 | Kawatani et al. | 134/182 |
| 5,651,836 | 7/1997 | Suzuki | 134/34 |
| 5,845,660 | 12/1998 | Shindo et al. | 134/56 R |
| 5,887,604 | 3/1999 | Murakami et al. | 134/102.2 |
| 5,887,605 | 3/1999 | Lee et al. | 134/102.2 |
| 5,896,874 | 4/1999 | Nakagawa et al. | 134/56 R |

*Primary Examiner*—Philip R. Coe
*Attorney, Agent, or Firm*—Smith, Gambrell & Russell, LLP

[57] ABSTRACT

Disclosed is a liquid treatment for an object to be processed, such as a semiconductor wafer or a glass LCD substrate, which is designed to remove any chemicals remaining in chemical supply nozzles and also improve the rinse capability and throughput. To that end, a processing liquid supply means is configured as jet nozzle pipes 40, a bottom surface 40c of each of the jet nozzle pipes 40 is inclined so as to slope downward from a chemical supply side thereof to an end portion, and the end portion is connected to a drain pipe 55 by a waste liquid orifice 40d and a drain valve 54. A chemical is supplied from nozzle orifices 40b of the jet nozzle pipes 40, the chemical is brought into contact with wafers W, and a treatment is performed thereby. Thereafter, a chemical-removing agent such as pure water or $N_2$ is supplied through the jet nozzle pipes 40 to remove any remaining chemical from the jet nozzle pipes 40, then pure water is brought into contact with the wafers W to wash them.

23 Claims, 22 Drawing Sheets

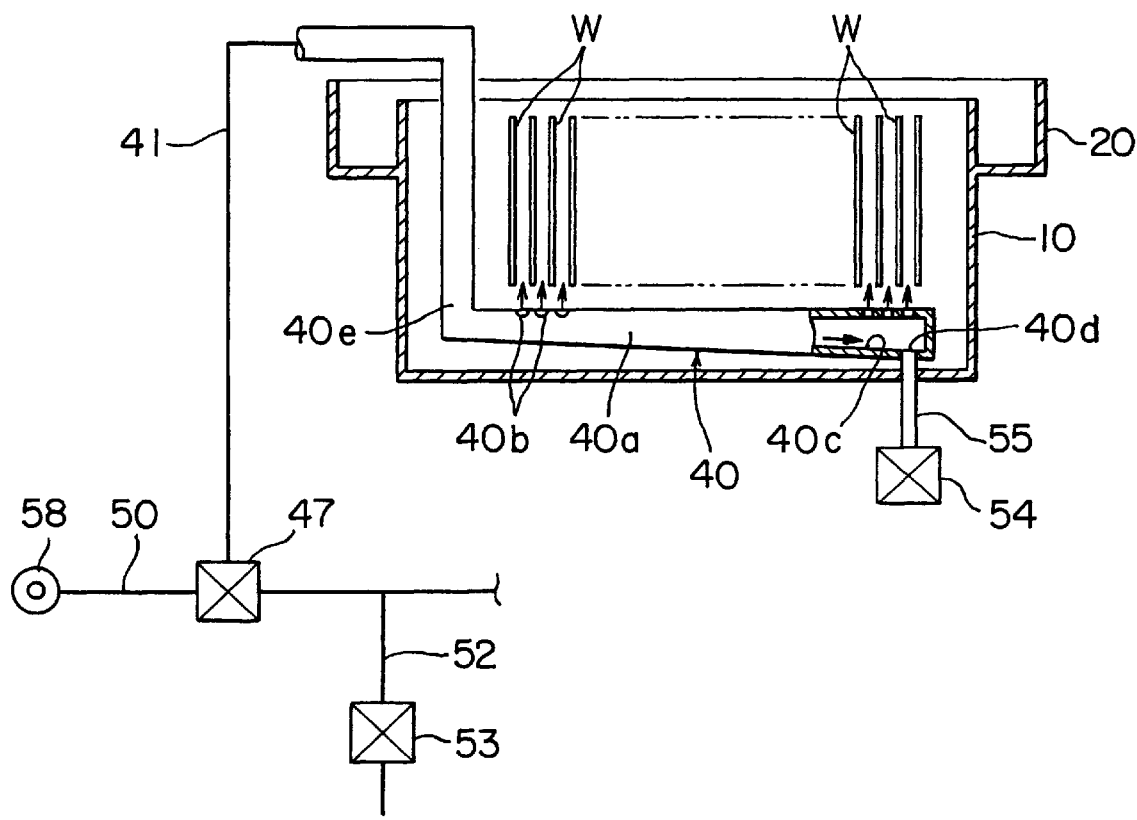
F I G. 2

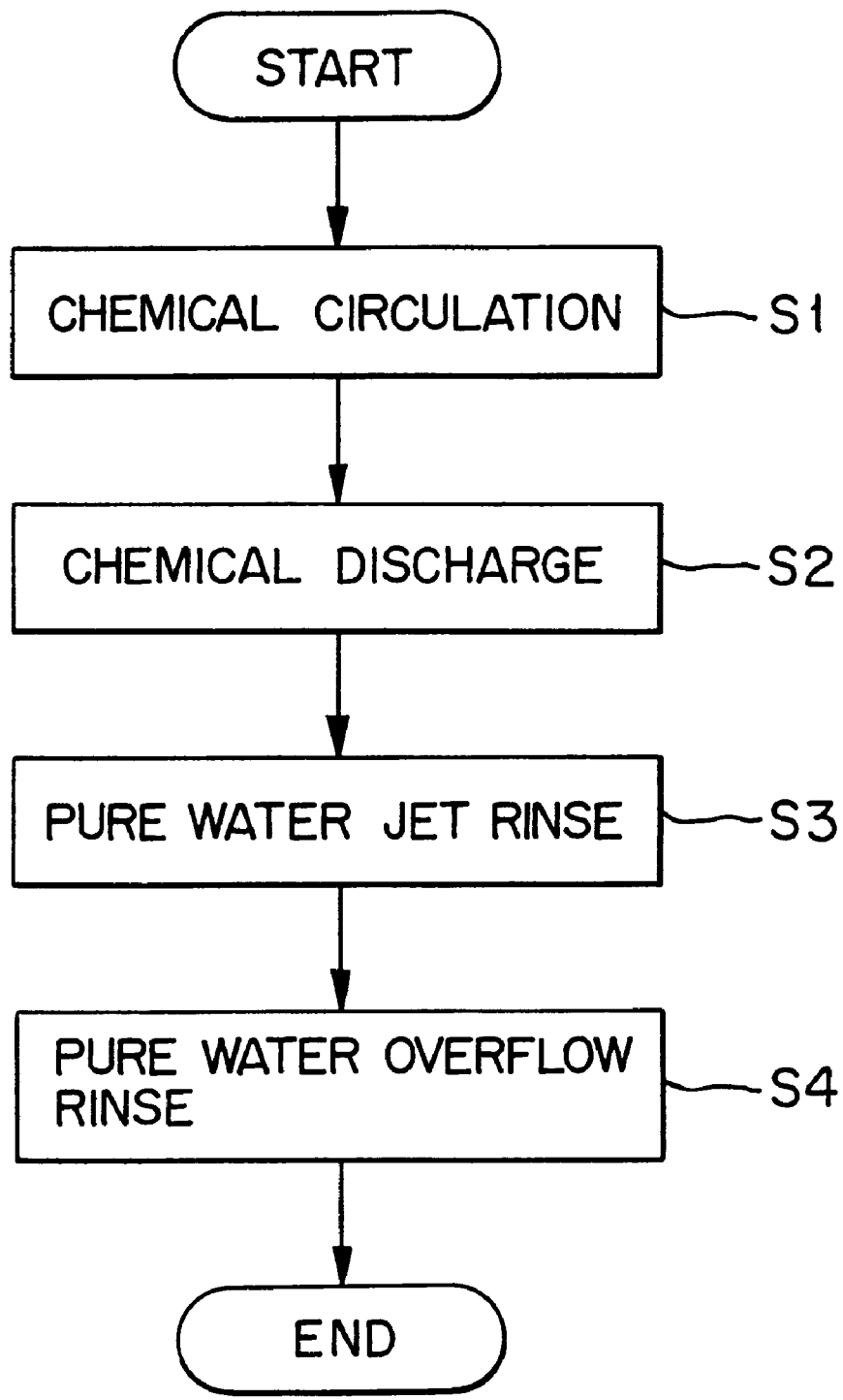
F I G. 8

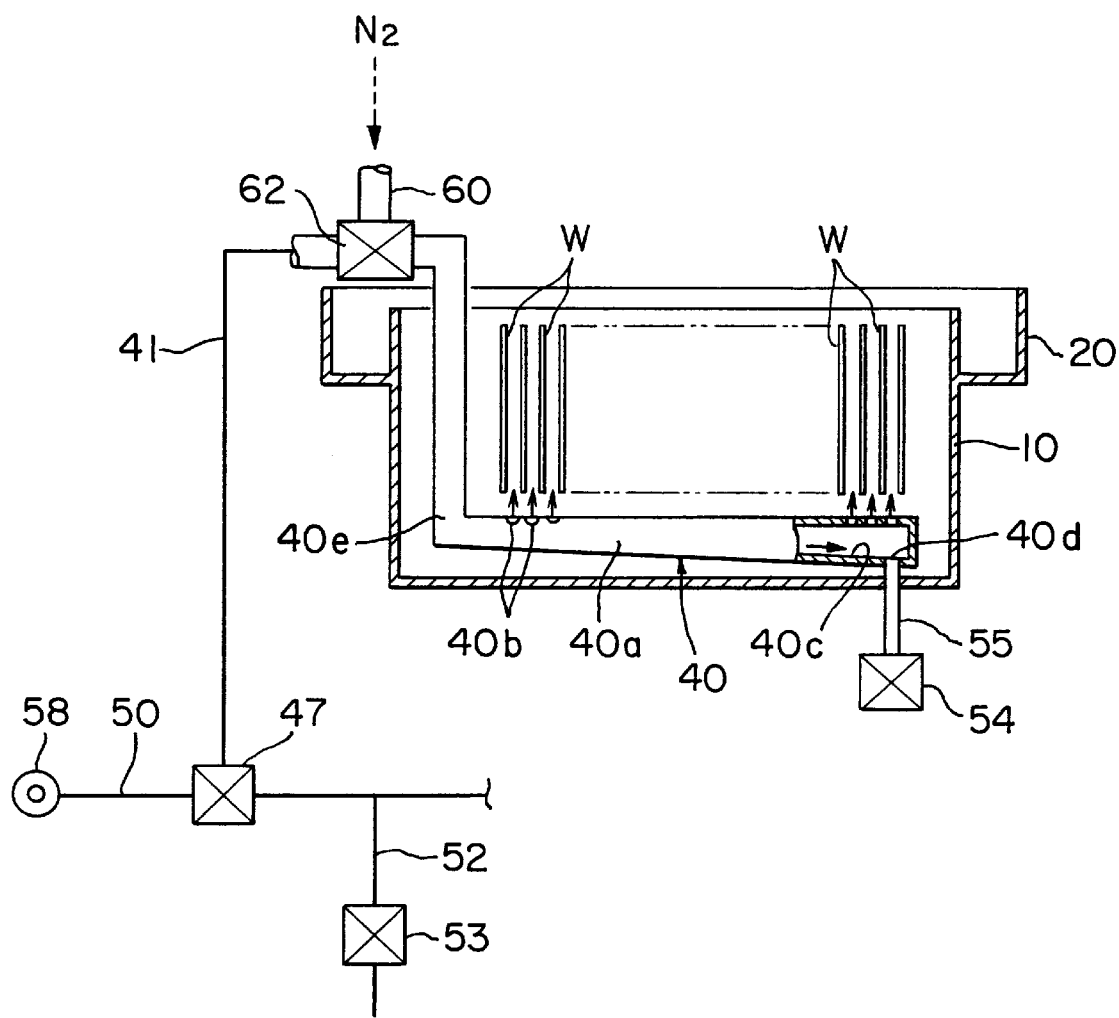
F I G. 10

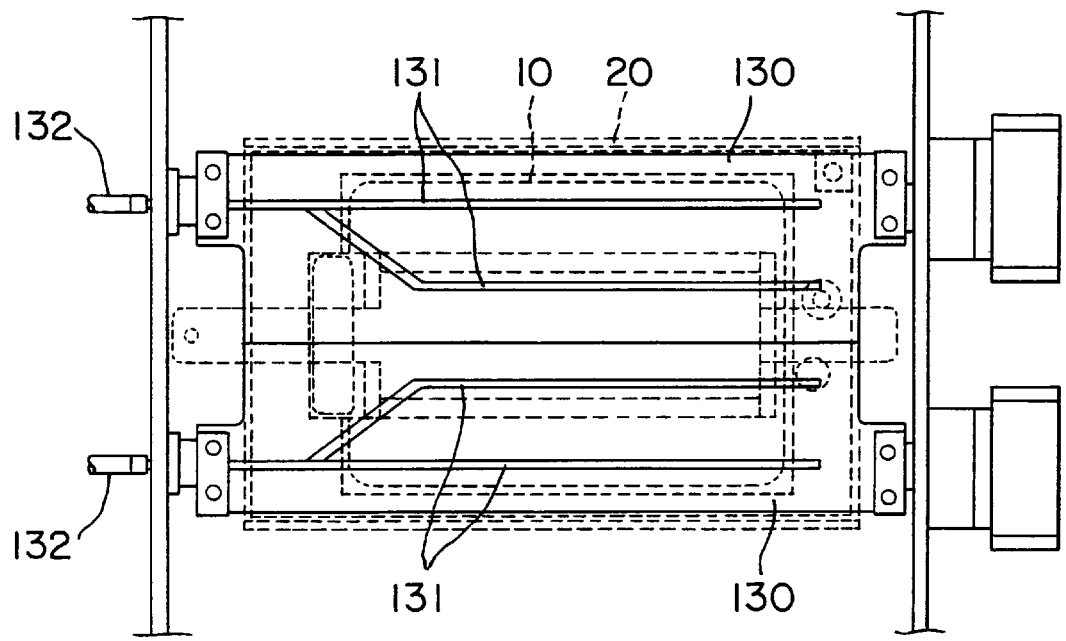
F I G. 28
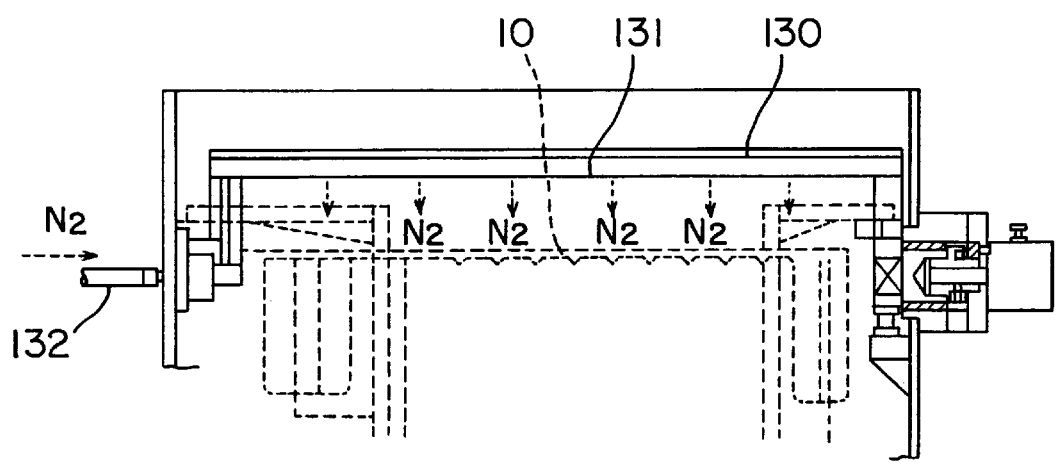
F I G. 29

LIQUID TREATMENT METHOD AND APPARATUS

This is a divisional of application Ser. No. 08/911,353, filed Aug. 7, 1997, and now U.S. Pat. No. 5,922,138.

BACKGROUND OF THE INVENTION

1. Field of the Invention

The present invention relates to a liquid treatment method and apparatus for washing an object to be processed, such as a semiconductor wafer or glass substrate for an LCD, with a washing liquid after the object to be processed has been treated with chemicals.

2. Description of Related Art

Liquid treatment methods that are widely used during the fabrication of semiconductor devices generally involve immersing objects to be processed, such as semiconductor wafers or glass substrates for LCDs (hereinafter referred to simply as "wafers"), in a sequence of baths filled with liquids such as chemicals or a washing liquid, to treat them and wash them.

The washing method described below is one known example of these liquid treatment methods. With this washing method, it is known to accommodate objects to be processed such as semiconductor wafers (hereinafter called "wafers") within a treatment bath while they are held in a holder means such as a wafer boat, and a processing liquid such as ammonia, hydrochloric acid, or hydrofluoric acid is supplied to the wafers in a jet from means such as a chemical supply nozzle. A circulating supply is set up, in other words, liquid is allowed to overflow from the treatment bath into the outer bath and is then circulated back from the outer bath into the treatment bath. After processing to remove contaminants such as particles or metal ions adhering to the wafers or remove oxide films therefrom, the chemicals are discharged. A washing liquid such as pure water is then supplied in a jet towards the wafers from a washing liquid supply nozzle, and water is also allowed to overflow from the treatment bath into the outer bath as the wafers are washed.

In this prior-art type of liquid treatment method, it often happens that the chemicals used in the chemical treatment will remain in the chemical supply nozzle after the chemicals have been discharged. There is a danger that such residual chemicals will subsequently dry to form particles that adhere to the wafers, or further problems could occur if they lower the resistivity of the pure water used during the washing after the treatment, causing a lowering of the washing efficiency.

This type of liquid treatment method has a further problem in that the necessity of providing two types of supply nozzle (the chemical supply nozzle and the washing liquid supply nozzle) plus the corresponding piping and attachment devices leads to an increase in size of the apparatus and complicates the installation.

SUMMARY OF THE INVENTION

The present invention was devised in the light of the above problems with the prior art and has as its objective the provision of a liquid treatment method and liquid treatment apparatus that are designed to remove chemicals remaining within the chemical supply nozzle, make it possible to improve washing efficiency and throughput, and also make it possible to design a more compact apparatus.

In order to achieve the above objective, this invention provides a liquid treatment method whereby a processing liquid is sent out from a processing liquid supply means and brought into contact with an object to be processed, a predetermined treatment is performed thereon, and then a washing fluid is brought into contact with the object to be processed to wash it. In accordance with this invention, a washing fluid is supplied through the processing liquid supply means after the predetermined treatment, to remove any processing liquid remaining within the processing liquid supply means, and also the washing fluid is brought into contact with the object to be processed to wash it.

This invention further provides a liquid treatment apparatus comprising a processing liquid supply means for supplying a processing liquid, to cause the processing liquid to be brought into contact with an object to be processed, and washing fluid supply means for supplying a washing fluid, to cause the washing fluid to be brought into contact with the object to be processed, wherein the liquid treatment apparatus is characterized in that a downstream side of the washing fluid supply means is connected to the processing liquid supply means and the washing fluid is supplied through the processing liquid supply means in such as manner as to come into contact with the object to be processed.

In accordance with the present invention, after a processing liquid has been supplied from the processing liquid supply means and the object to be processed has been subjected to the predetermined treatment, any chemicals remaining within the processing liquid supply means can be removed by supplying a washing fluid into the same processing liquid supply means. In addition, the washing fluid can be brought into contact with the object to be processed to perform a washing process thereof, which dramatically increases the efficiency with which the object to be processed is washed and also makes it possible to increase throughput and prevent the adhesion of particles to the object to be processed. It is also possible to reduce the number of structural components, because the same means is used in common for supplying the processing liquid and the washing fluid, and thus the apparatus can be made more compact.

The washing fluid for removing the processing liquid remaining in the processing liquid supply means may be a liquid such as pure water, or it could be a gas such as an inert gas.

In addition to supplying the washing fluid by using the processing liquid supply means, the washing fluid can be supplied in a shower to the object to be processed from above, or it can be supplied rapidly to the object to be processed by the force of gravity or by pressurizing means from the washing fluid tank. This supply of washing fluid makes the washing of the object to be processed even more effective, thus making it possible to reduce the time required for the washing fluid to recover its predetermined resistivity.

By discharging the processing liquid after the predetermined treatment, supplying the liquid washing fluid through the processing liquid supply means after the processing liquid has been discharged, and gradually immersing the object to be processed in the washing fluid while jetting the washing fluid onto the object to be processed, the time required for removing any processing liquid that remains after the predetermined treatment and replacing it with the washing fluid can be shortened, and thus the time required for the washing fluid to recover its predetermined resistivity can also be shortened.

After the liquid washing fluid has been jetted from below the object to be processed by the washing fluid supply means and the washing fluid supply means has been immersed in the washing fluid, the above described time-shortening can be made even more effective by increasing the rate of supply of the washing fluid.

The time required for the predetermined resistivity of the washing fluid to recover can be shortened by supplying an inert gas into the environment surrounding the object to be processed during the washing, thus preventing carbon dioxide from dissolving into the washing fluid, which makes it possible to reduce the amount of washing fluid used and also shorten the washing time.

The processing liquid supply means may be configured of a horizontally orientated jet nozzle pipe, where a base surface of this jet nozzle pipe is inclined so as to slope downward from a processing liquid supply side thereof towards a drain portion at the end of the jet nozzle pipe. This configuration makes it possible for any processing liquid remaining within the jet nozzle pipe to flow more positively towards the drain portion and be discharged.

BRIEF DESCRIPTION OF THE DRAWINGS

FIG. 2 is a sectional view of essential components of the first embodiment;

FIG. 8 is a flowchart of the operating sequence of the first embodiment;

FIG. 10 is a sectional view of essential components of the second embodiment;

FIGS. 23b and 23c are partial views of variations that differ slightly from the embodiment of FIG. 23a;

FIG. 28 is a plan view of FIG. 27; and

FIG. 29 is a side view of FIG. 28.

DESCRIPTION OF THE PREFERRED EMBODIMENTS

Embodiments of the present invention will be described below with reference to the accompanying drawings. These embodiments relate to examples in which this invention is applied to a semiconductor wafer washing apparatus.

First Embodiment

Figure 1:
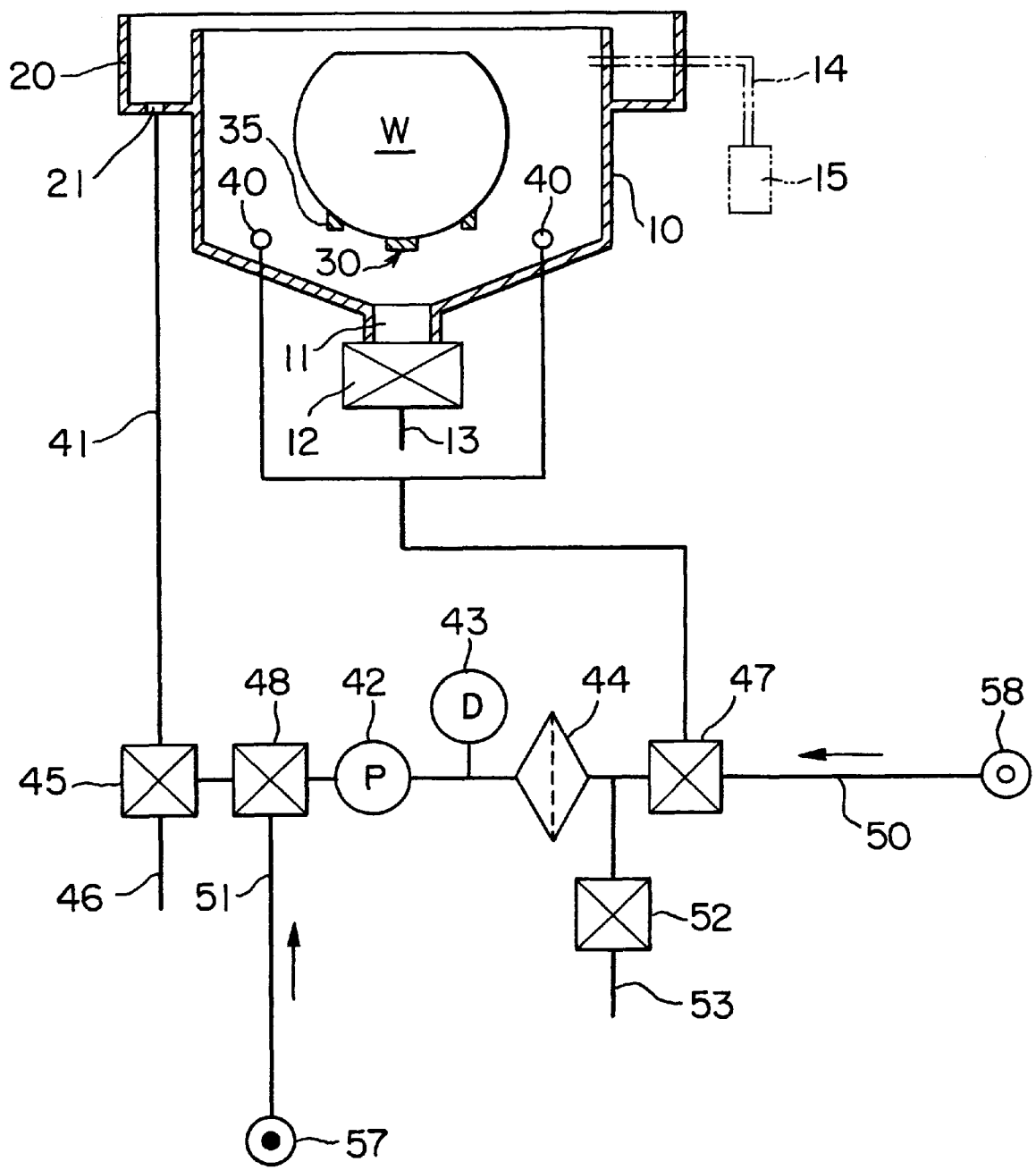
FIG. 1 is a schematic cross-sectional view of a first embodiment of a liquid treatment apparatus in accordance with the present invention.

A schematic sectional view of a first embodiment of a liquid treatment apparatus relating to this invention is shown in FIG. 1 and a sectional view of essential components thereof is shown in FIG. 2.

This liquid treatment apparatus is provided with a treatment bath 10 which accommodates semiconductor wafers W (hereinafter called "wafers") that are the objects to be processed; an outer bath 20 which is connected in close proximity to an aperture edge at an upper end of the treatment bath 10 and which collects a processing liquid such as ammonia, hydrochloric acid, or hydrofluoric acid or a washing liquid such as pure water that overflows from the aperture edge of the treatment bath 10; a holder means such as a wafer boat 30 which holds a predetermined number of wafers W, such as 50 wafers W, within the treatment bath 10 in a state in which they are arrayed at a suitable spacing; and a supply means such as jet nozzle pipes 40 disposed in a base portion of the treatment bath 10 to supply a chemical or pure water 1 to the wafers W.

The treatment bath 10 and the outer bath 20 are formed of a material that has good corrosion resistance and chemical resistance, such as quartz. A waste liquid port 11 is provided in the base portion of the treatment bath 10 and a drain pipe 13 is connected to the waste liquid port 11 by a drain valve 12. Note that a pure water discharge pipe 14 is connected to an upper portion of the treatment bath 10, such as in a position that is between 20 and 40 mm below the upper edge of the treatment bath 10, with the configuration being such that the resistivity of water within the treatment bath 10 is measured by a resistivity detector 15 that is connected to the pure water discharge pipe 14.

A waste liquid aperture 21 is provided in a base portion of the outer bath 20 and a circulation pipeline 41 is connected between this waste liquid aperture 21 and the jet nozzle pipes 40. A pump 42, a damper 43, and a filter 44 are provided in this circulation pipeline 41, in sequence from the waste liquid aperture 21 side. A drain pipe 46 is connected between the waste liquid aperture 21 and the pump 42 by a switching valve 45, another switching valve 48 is provided between the switching valve 45 and the pump 42, and a chemical supply pipe 51 is connected to the switching valve 48. A chemical supply source 57 is connected to the chemical supply pipe 51. In addition, a further switching valve 47 is provided between the filter 44 and the jet nozzle pipes 40, and a pure water supply pipe 50 is connected to the switching valve 47. A pure water supply source 58 is connected to the pure water supply pipe 50. A drain pipe 53 is connected between the filter 44 and the switching valve 47 by a drain valve 52.

Figure 3:
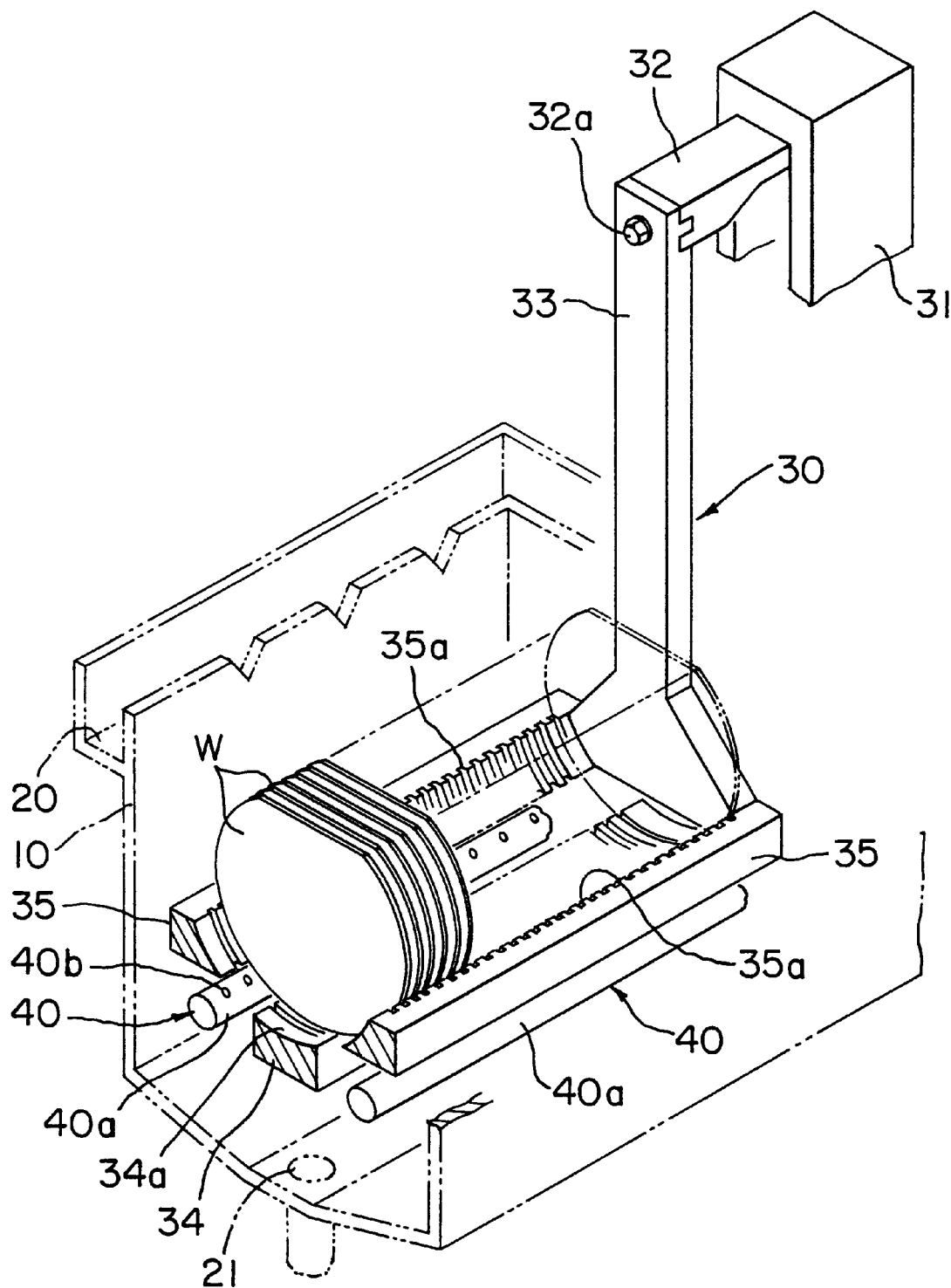
FIG. 3 is a perspective view of a means for holding objects to be processed in accordance with this invention.

As shown in FIGS. 2 and 3, each jet nozzle pipe 40 is provided with a tubular main nozzle pipe 40a, which is disposed on either side below the wafers W held in the wafer boat 30, and a large number of nozzle orifices 40b, which are pierced through the main nozzle pipe 40a at a suitable spacing in the longitudinal direction. A base surface 40c of each main nozzle pipe 40a is inclined so as to slope downward from a supply side 40e thereof, through which is supplied a liquid such as a chemical or pure water, and a drain pipe 55 for discharge is connected by an on/off means such as a drain valve 54 to a waste liquid orifice 40d provided in a distal end base surface thereof. Thus the configuration is such that any chemical or water remaining within each of the jet nozzle pipes 40 ultimately flows to the distal end thereof and is discharged from the drain pipe 55 through the waste liquid orifice 40d.

Contaminants such as particles, metal ions, and oxide films can be prevented from adhering to the surfaces of the wafers W by the above described provision of the circulation piping system between each jet nozzle pipe 40 and the outer bath 20. This configuration also ensures that chemicals that are supplied from the chemical supply source 57 into the treatment bath 10 overflow therefrom, are circulated through the circulation pipeline 41, and are supplied again to the wafers W from the nozzle orifices 40b of the jet nozzle pipes 40. After the chemicals have been discharged, any remaining chemicals in the jet nozzle pipes 40 can be removed by switching the switching valve 47 to supply water to the jet nozzle pipes 40 from the pure water supply source 58, and any chemicals adhering to the wafers W can also be removed by jetting the water from the nozzle orifices 40b of the jet nozzle pipes 40 onto the wafers W. Note that, in this case, the water overflowing from the treatment bath 10 is discharged through the switching valve 45 and the drain pipe 46. In this configuration, water is supplied from the jet nozzle pipes 40 to remove adhering chemicals, but water supply portions could also be provided separately in locations such as the base or upper side of the treatment bath 10 so that water is supplied therefrom during this chemical discharge step, in addition to the supply from the jet nozzle pipes 40.

Note also that the configuration could be such that a pure water tank is provided above the treatment bath 10 and the outer bath 20, as will be described later with reference to another embodiment of this invention, and water from this tank could be supplied rapidly into the treatment bath 10 through the outer bath 20 or directly into the treatment bath 10.

As shown in FIG. 3, the wafer boat 30 is provided with a pair of inverted T-shaped support members 33 (only one is shown in the figure), each of which is fixed by a bolt 32a to an attachment member 32 that is linked to an elevator mechanism 31 disposed on the outer side of the treatment bath 10; a central support bar 34 that is suspended between central lower ends of the support members 33; and two side support bars 35 that are suspended on either side of the support member 33, parallel thereto. The wafer boat 30 is configured to be lowered into and raised out of the treatment bath 10 by the driving of the elevator mechanism 31. Note that in this case a plurality of holder grooves 34a and 35a (such as 50 grooves each) are provided in each of the central support bar 34 and the side support bars 35, at a suitable spacing in the longitudinal direction. These support bars 34 and 35 are formed of a material that has superb corrosion resistance, thermal resistance, and strength, such as polyether ethelketone (PEEK) or quartz.

Figure 4:
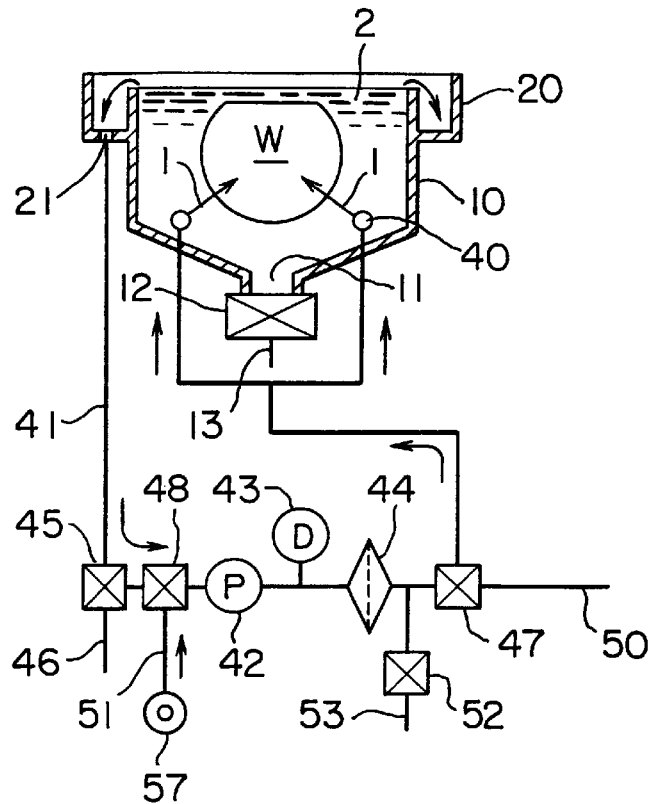
FIG. 4 is a schematic diagram illustrative of a chemical treatment step of the first embodiment.

The procedure with which the wafers W are subjected to a chemical treatment and are then washed in the liquid treatment apparatus of this first embodiment will now be described with reference to the schematic sectional views of FIGS. 4 to 7 and the flowchart of FIG. 8. First of all, a plurality of wafers W, such as 50 wafers, that are conveyed by a wafer chuck (not shown in the figures) are placed in the wafer boat 30 and disposed in the treatment bath 10, as shown in FIG. 4. A chemical 2 that is a processing liquid such as ammonia, hydrochloric acid, or hydrofluoric acid is then supplied from the chemical supply source 57 into the treatment bath 10. The chemical 2 in the treatment bath 10 is made to overflow from the treatment bath 10. The overflowing chemical 2 is jetted towards the wafers W from the nozzle orifices 40b of the jet nozzle pipes 40, by the driving of the pump 42 of the circulation pipeline 41, to remove any particles, metal ions, or oxide films adhering to the surfaces of the wafers W. This is a chemical circulation step Si in FIG. 8.

Figure 5:
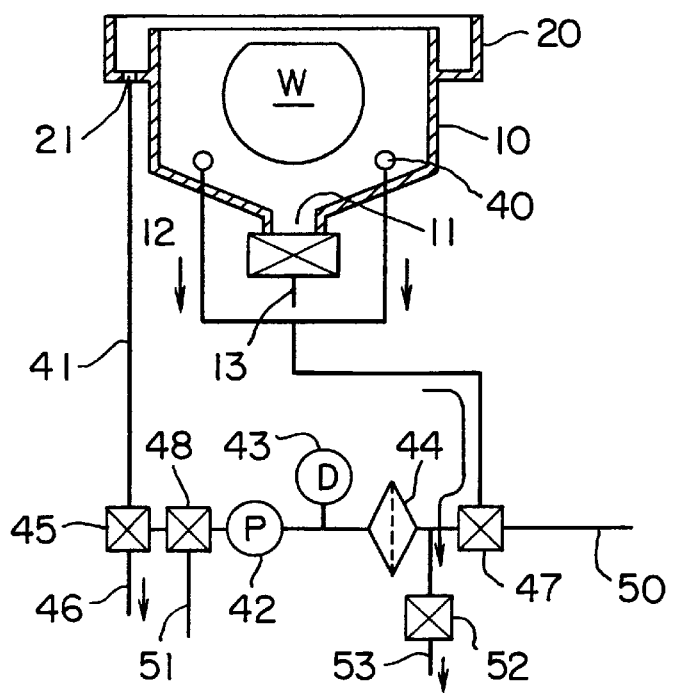
FIG. 5 is a schematic diagram illustrative of a chemical discharge step of the first embodiment.

After the chemical treatment has continued for a predetermined time, the circulation and supply of the chemical 2 is halted, the chemical 2 within the treatment bath 10 is discharged from the drain pipe 13 connected to the waste liquid port 11, as shown in FIG. 5, and the chemical within the circulation pipeline 41 is also discharged from the drain pipes 46 and 53. This is a chemical discharge step S2 in FIG. 8.

Figure 6:
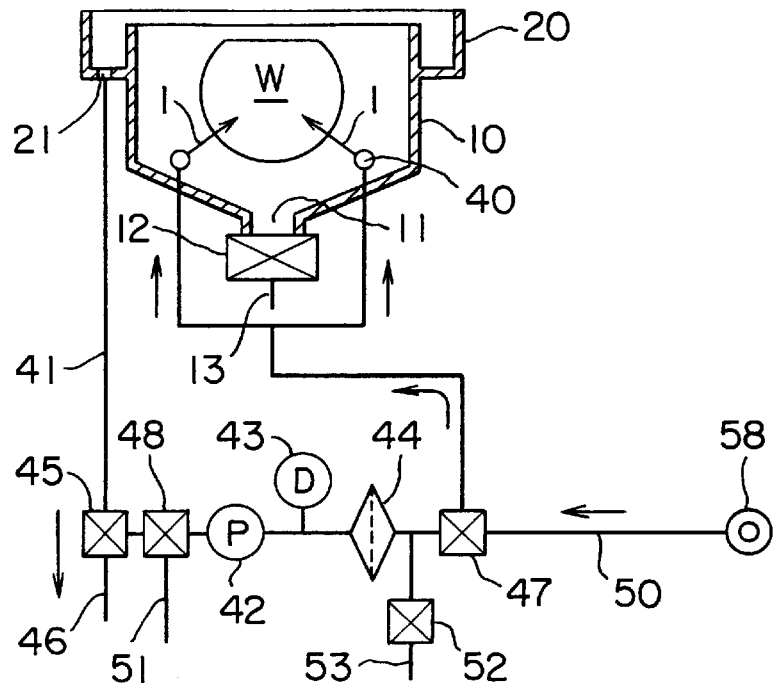
FIG. 6 is a schematic diagram illustrative of a pure water jet rinse step of the first embodiment.
Figure 7:
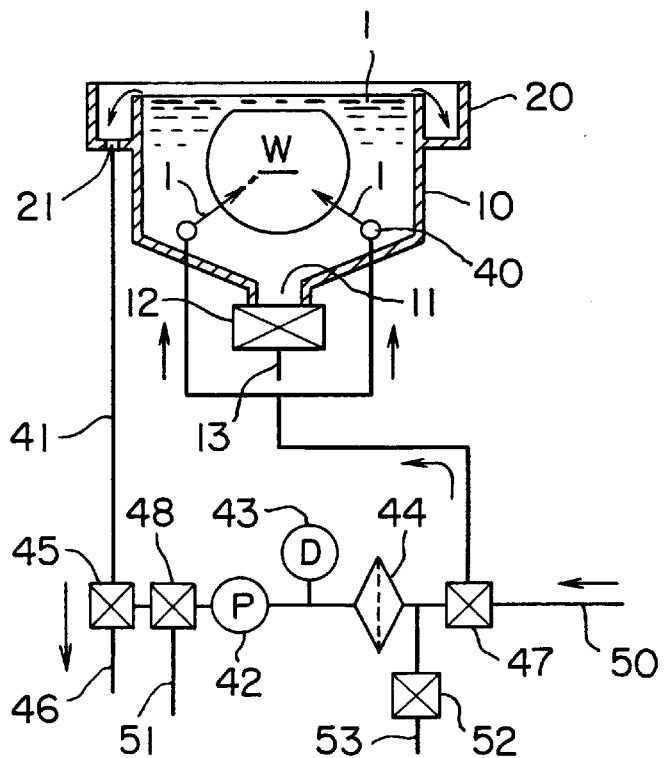
FIG. 7 is a schematic diagram illustrative of a pure water overflow rinse step of the first embodiment.

The chemical 2 remaining in the jet nozzle pipes 40 is removed from the drain pipe 55 (see FIG. 2) connected to the waste liquid orifice 40d by switching the switching valve 47 so that pure water 1 that is supplied from the pure water supply source 58 flows within the jet nozzle pipes 40, as shown in FIG. 6. Discharge of the remaining chemical is ensured by the inclination of the base surface of each jet nozzle pipe 40. The drain valve 54 is then closed, or the drain valve 54 is opened slightly to discharge any fluid accumulating in the drain pipe 55, and the pure water 1 is jetted towards the wafers W from the nozzle orifices 40b of the jet nozzle pipes 40 to wash the wafers W. This is a water jet rinse step S3 in FIG. 8. Continuing this step causes the pure water 1 to accumulate in the treatment bath 10 then overflow from the treatment bath 10 into the outer bath 20, and it is discharged to the exterior through the drain pipe 46 that branches off from the circulation pipeline 41, as shown in FIG. 7. This is a water overflow rinse step S4 in FIG. 8.

In this manner, the pure water 1 overflows and rinses the surfaces such as the outer surfaces of the nozzle orifices 40b and the jet nozzle pipes 40 and the inner surface of the vessel for the treatment bath 10. At a timing at which the water within the treatment bath 10 exceeds a predetermined resistivity, as measured by the resistivity detector 15 (see FIG. 1), the wafers W are grasped by the wafer chuck (not shown in the figures) and are removed to the exterior.

Second Embodiment

Figure 9:
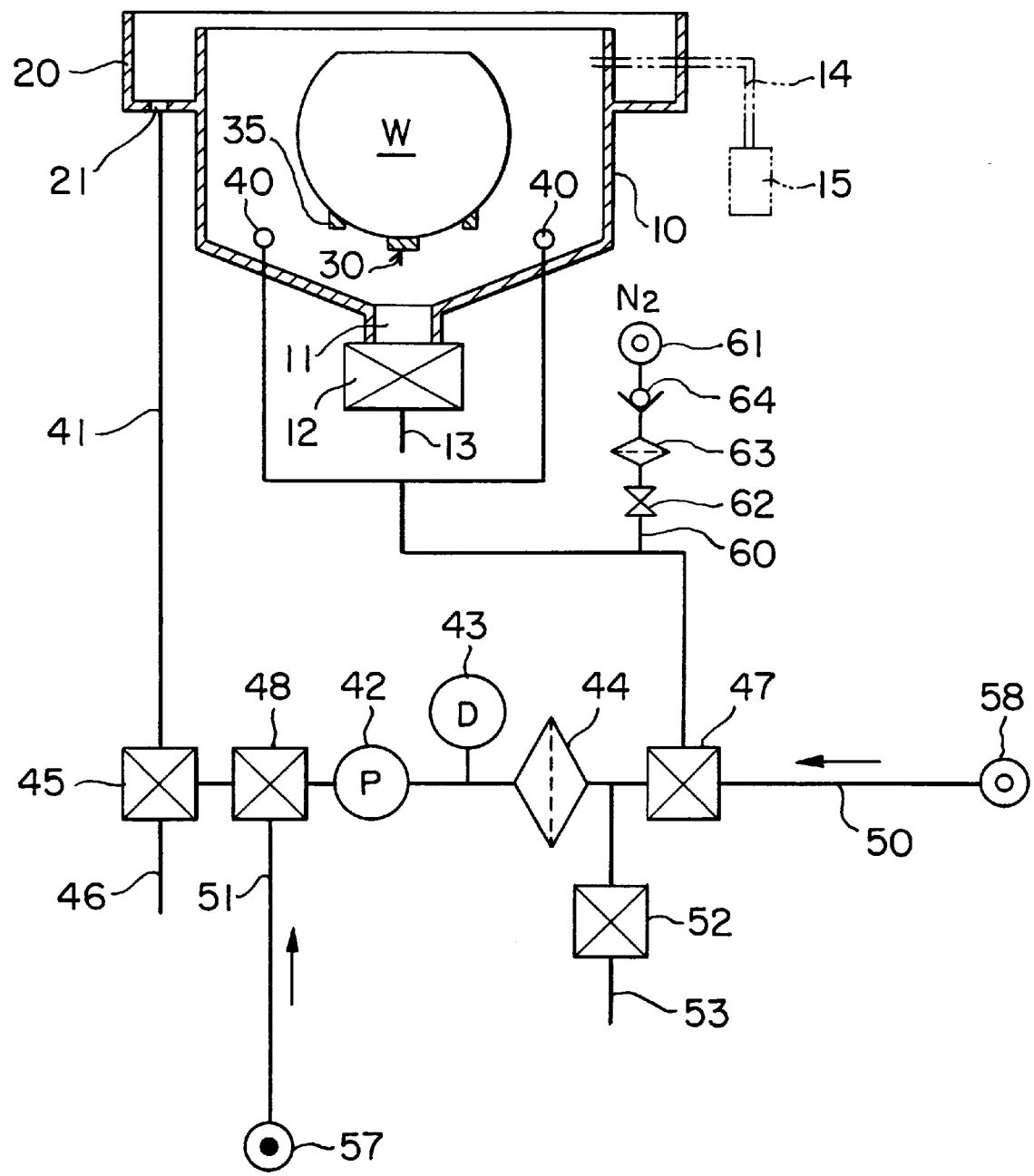
FIG. 9 is a schematic sectional view of a second embodiment of a liquid treatment apparatus in accordance with the present invention.

A schematic sectional view of a second embodiment of a liquid treatment apparatus according to this invention is shown in FIG. 9 and a sectional view of essential components thereof is shown in FIG. 10.

In this second embodiment, a gas supply source 61 for chemical removal (hereinafter called an $N_2$ supply source) is connected by a supply pipe 60 for an inert gas such as $N_2$, for removing chemicals from the processing liquid, between the circulation pipeline 41 and switching valve 48 of a liquid treatment apparatus that is otherwise configured in the same way as the apparatus of the above described first embodiment. An on/off valve 62 and a filter 63 are provided within the supply pipe 60, and a non-return valve 64 is provided between the filter 63 and the $N_2$ supply source 61.

The above described configuration makes it possible to supply $N_2$ into the jet nozzle pipes 40 from the $N_2$ supply source 61 so that this $N_2$ can be used to remove any chemicals remaining within the jet nozzle pipes 40. Note that the above description concerned the use of $N_2$ as the gas for removing chemicals, but the present invention is not limited thereto and any other inert gas could be used instead of $N_2$, or even clean air or the like could be used therefor.

It should be noted that the other components of this second embodiment are the same as those of the first embodiment, so they are denoted by the same reference numbers in the figures and further description thereof is omitted.

The procedure with which the wafers W are subjected to a chemical treatment and are then washed in the liquid treatment apparatus of this second embodiment will now be described with reference to the schematic sectional view of FIG. 11 and the flowchart of FIG. 12. Note that the chemical circulation process and the chemical discharge are performed in the same sequence as in the first embodiment, so this description merely concerns the procedure from the step of removing chemicals from the jet nozzle pipes 40 onward.

Figure 11:
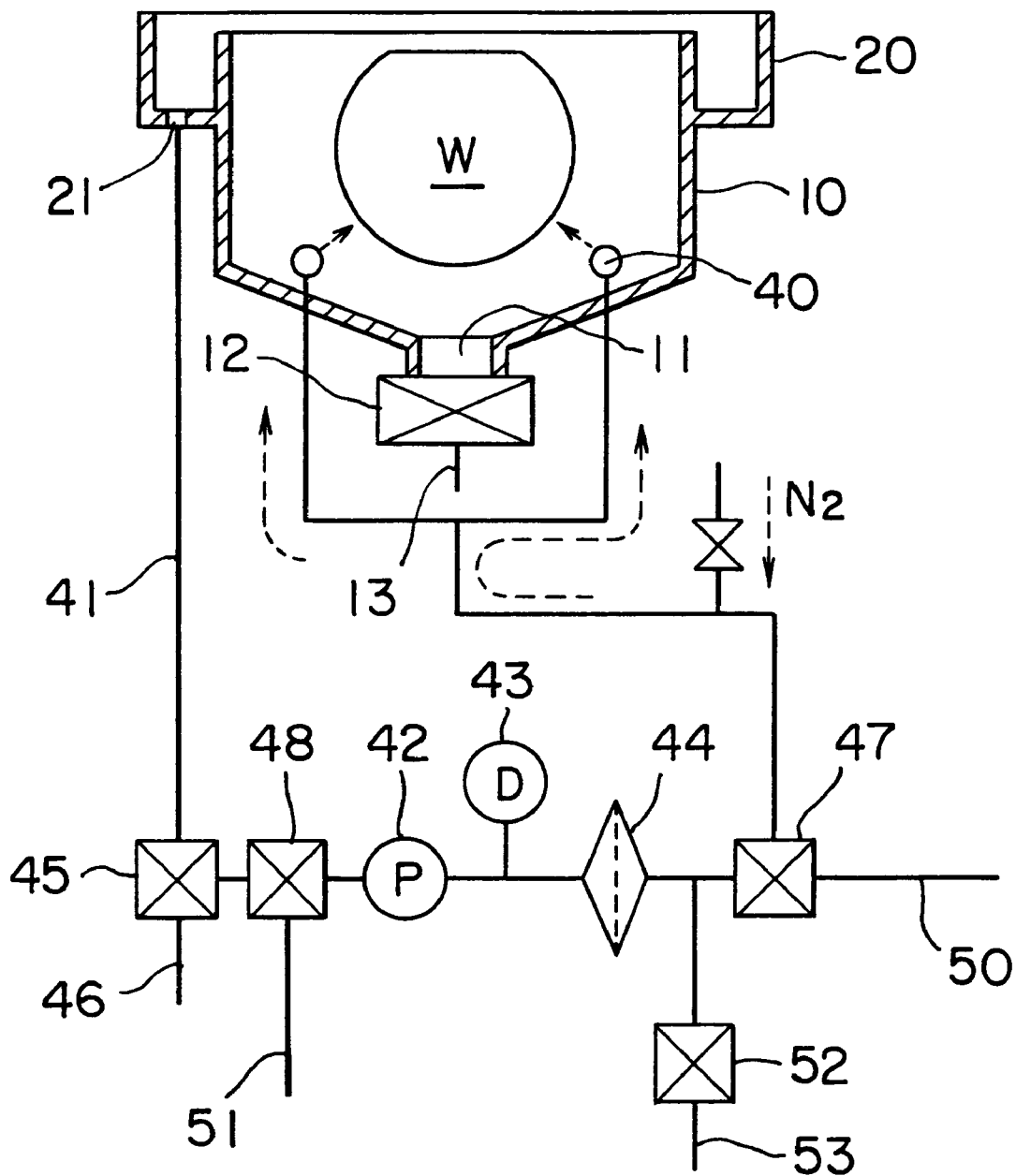
FIG. 11 is a schematic diagram illustrative of a residual chemical processing step in accordance with the second embodiment.
Figure 12:
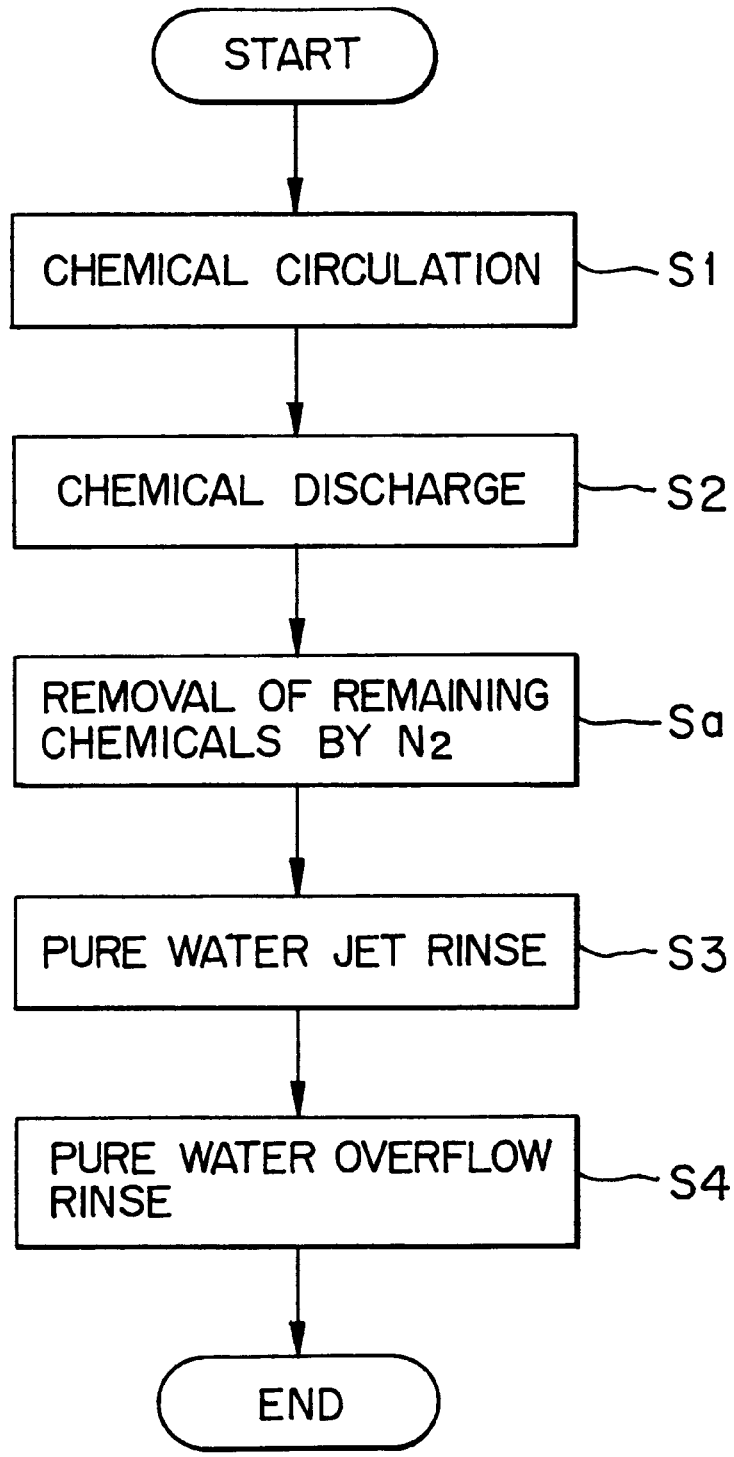
FIG. 12 is a flowchart of the operating sequence of the second embodiment.

After the chemical circulation step S1 has been done and the chemical has been discharged by the chemical discharge step S2, the switching valve 47 is closed and the on/off valve 62 is opened so that $N_2$ supplied from the $N_2$ supply source 61 flows into the jet nozzle pipes 40 as shown in FIG. 11, and thus the chemical 2 remaining within the jet nozzle pipes 40 is removed through the drain pipe 55 connected to each waste liquid orifice 40d. This is a remaining chemical removal step Sa in FIG. 12.

The drain valve 54 (see FIG. 10) is then closed, or the drain valve 54 is opened slightly to discharge any liquid accumulating in the drain pipe 55, the on/off valve 62 is closed, and the switching valve 47 is opened so that pure water 1 supplied from the pure water supply source 58 is jetted towards the wafers W from the nozzle orifices 40b of the jet nozzle pipes 40, to wash the wafers W. This is a water jet rinse step S3 in FIG. 12. Continuing this supply of pure water causes the water 1 to accumulate in the treatment bath 10 then overflow from the treatment bath 10 into the outer bath 20, and it is discharged to the exterior through the drain pipe 46 that branches off from the circulation pipeline 41, in the same manner as in the first embodiment. This is a water overflow rinse step S4 in FIG. 12

In this manner, the pure water 1 overflows and rinses the surfaces. At a time point at which the water within the treatment bath 10 exceeds a predetermined resistivity, as measured by the resistivity detector 15, the wafers W are grasped by the wafer chuck (not shown in the figures) and are removed to the exterior.

Washing/Drying System

Figure 13:
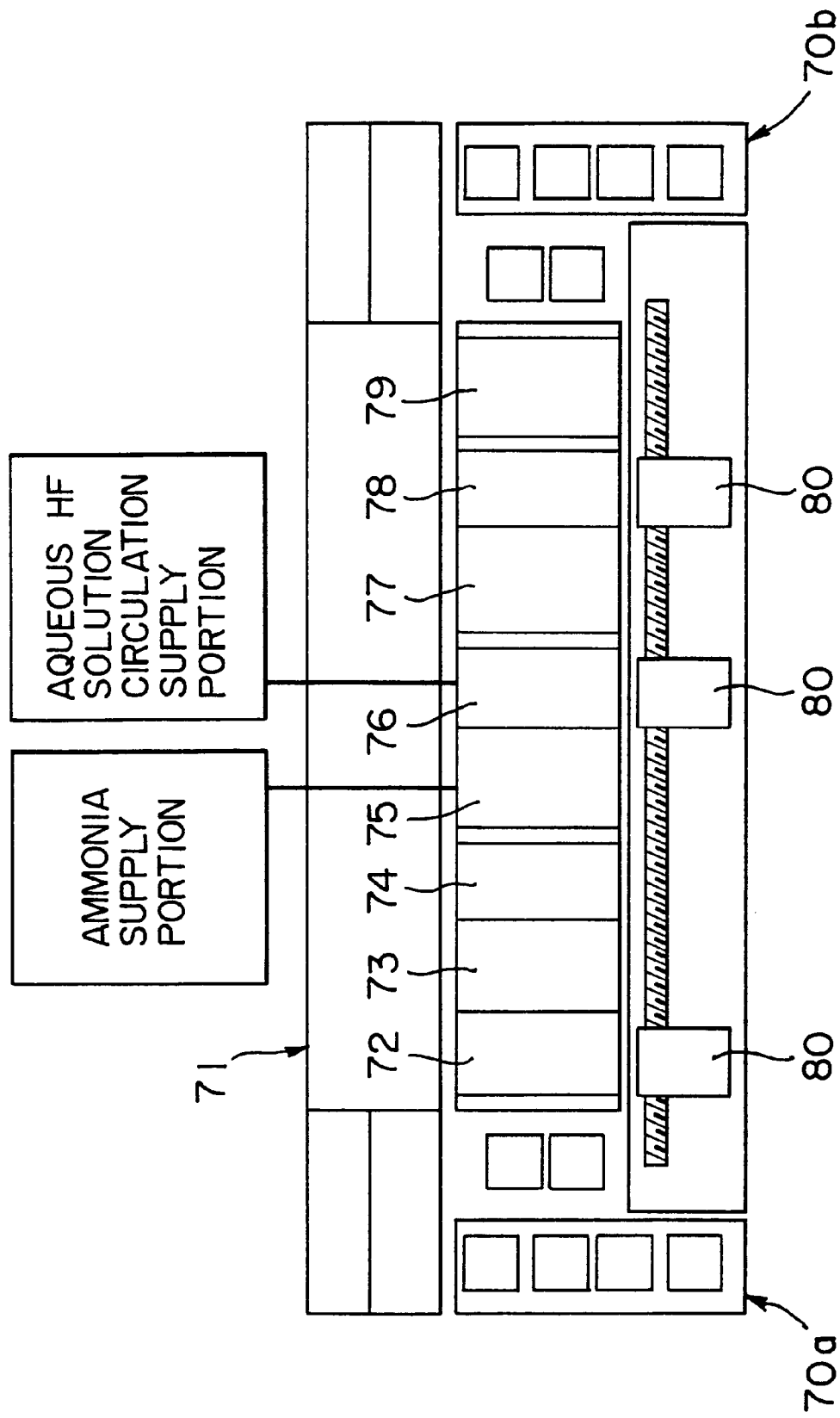
FIG. 13 is a schematic plan view of an example of a washing/drying system that incorporates the liquid treatment apparatus of this invention.

The liquid treatment apparatus of the above described configuration can be used as a simple chemical-treatment and washing apparatus, but it could also be used as being incorporated into a wafer washing/drying system. The essential components of such a washing/drying system, as shown by way of example in FIG. 13, are an intake portion 70a which contains unprocessed wafers W, a washing/drying portion 71 in which the wafers W are washed and dried, an outlet portion 70b which contains wafers W that have been dried, and a plurality of wafer chucks 80, such as three wafer chucks 80, which are disposed beside the washing/drying portion 71 to convey a predetermined number of wafers W, such as 50 wafers W.

Within the washing/drying portion 71 are disposed a first chuck washing/drying unit 72, a first chemical treatment unit 73, a first water washing unit 74, a second chemical treatment unit 75 such as an ammonia treatment unit similar to that provided in the above described liquid treatment apparatus, a third chemical treatment unit 76 such as a hydrofluoric acid (aqueous HF solution) treatment unit, a second water washing unit 77, and a second chuck washing/drying unit 78, in a linear sequence from the intake portion 70a to the outlet portion 70b.

In the thus-configured washing/drying system, unprocessed wafers W are conveyed by the wafer chucks 80 in sequence through the various units 73, 74, 75, 76, and 77 of the washing/drying portion 71 and, after predetermined chemical treatments and washing have been performed, they are conveyed into a drying unit 79 to be dried.

Note that this embodiment has been described as concerning the application of the liquid treatment apparatus of this invention to an apparatus for washing semiconductor wafers, but it should be obvious to those skilled in the art that it can equally well be applied to the drying of other objects to be processed, such as glass substrates for LCDs.

Third Embodiment

Figure 14:
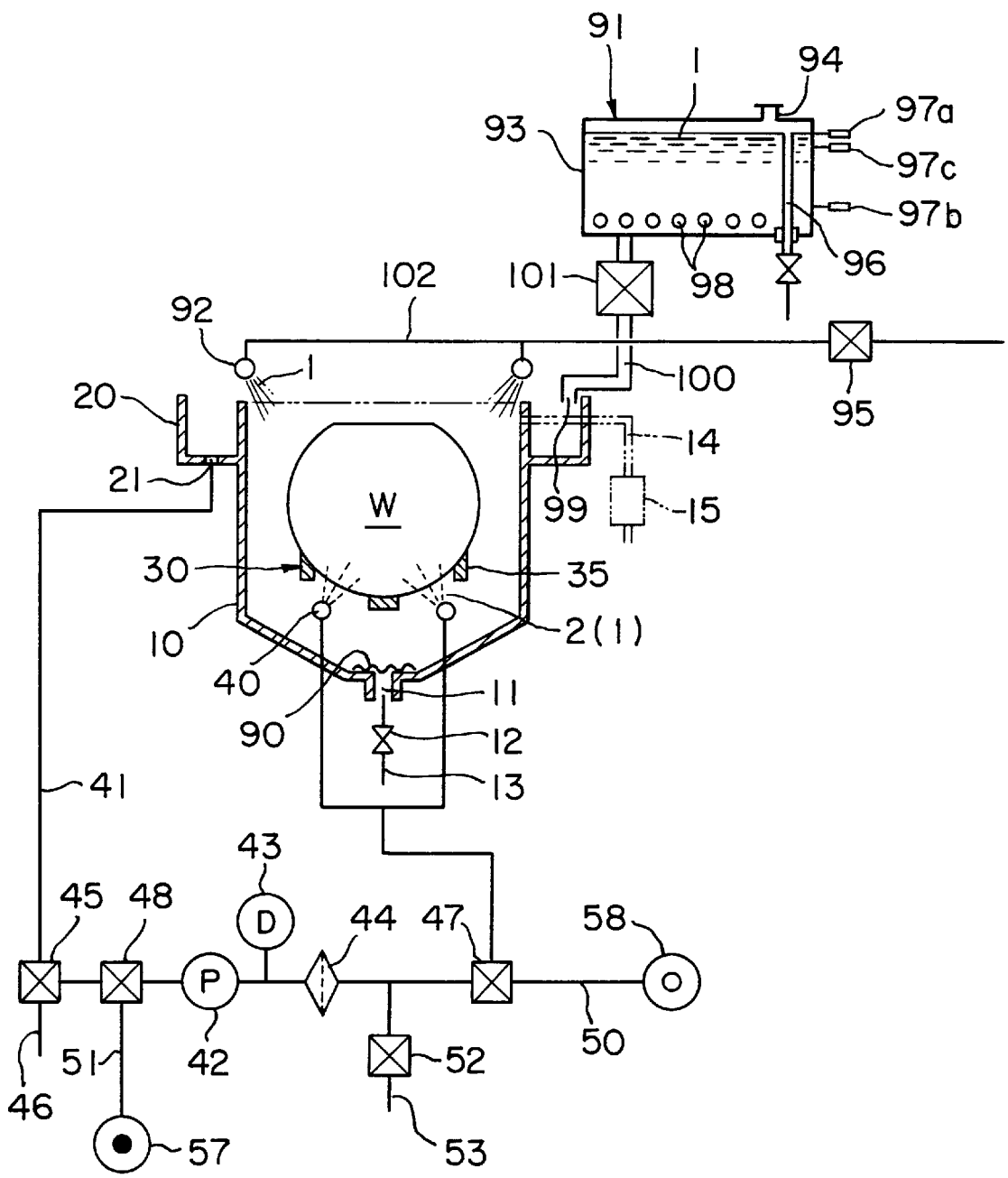
FIG. 14 is a schematic sectional view of a third embodiment of a liquid treatment apparatus in accordance with the present invention.

A third embodiment of this invention is shown in FIG. 14. Components of this embodiment that are common to the apparatus of the first embodiment are denoted by the same reference numbers and further description thereof is omitted. Only portions that are different are described below.

This third embodiment of the invention is further provided with a pure water tank 91, which contains pure water 1 that can be supplied rapidly to the treatment bath 10, and washing liquid supply means, such as shower nozzle pipes 92, which supplies water from a source such as a pure water line of the factory to the wafers W in the treatment bath 10 and the interior of the outer bath 20. A filtering mesh 90 is also provided in the waste liquid port 11 of the treatment bath 10.

The pure water tank 91 is provided with an atmosphere introduction port 94 at an upper end of a hermetically sealed main tank body 93, which introduces atmospheric air while pure water 1 is being supplied into the treatment bath 10. An overflow pipe 96 for maintaining the amount of pure water 1 in the tank at a constant level is disposed within the main tank body 93. In addition, an upper sensor 97a, a lower sensor 97b, and a predetermined quantity sensor 97c are disposed in the vicinity of the outer side of the main tank body 93 to detect the upper limit of the liquid surface of the pure water 1, the lower limit thereof, and a suitable quantity thereof, respectively. The configuration is such that these sensors ensure that there is always a predetermined quantity of the pure water 1 within the tank 91. In this case, the volume of pure water 1 within the tank must be at least enough to supply a single quantity rapidly into the treatment bath 10, such as at least 35 liters, and it is preferably 70 liters, enough to supply two such quantities rapidly. Note that a heater 98 consisting of, for example, a heater wire passing through a quartz tube is disposed in a base portion of the main tank body 93, with the configuration being such that the pure water 1 can be heated to a predetermined temperature of, for example, 60 to 80° C. The reason why the pure water 1 in the tank is heated to 60 to 80° C. is to increase the washing efficiency of the pure water 90.

A supply port (not shown in the figure) that is provided in a base portion of the main tank body 93 of the thus-configured pure water tank 91 is connected to a supply nozzle 99 by way of a supply pipe 100. The configuration is such that pure water 1 within the pure water tank 91 is supplied from the supply nozzle 99 to the wafers W in the treatment bath 10 and the interior of the outer bath 20, by the opening and closing of a supply valve 101 interposed in the supply pipe 100. Note that the supply nozzle 99 need not necessarily be positioned above the baths 10 and 20; it could equally well open into a lower portion or a side portion within the treatment bath 10.

Figure 15:
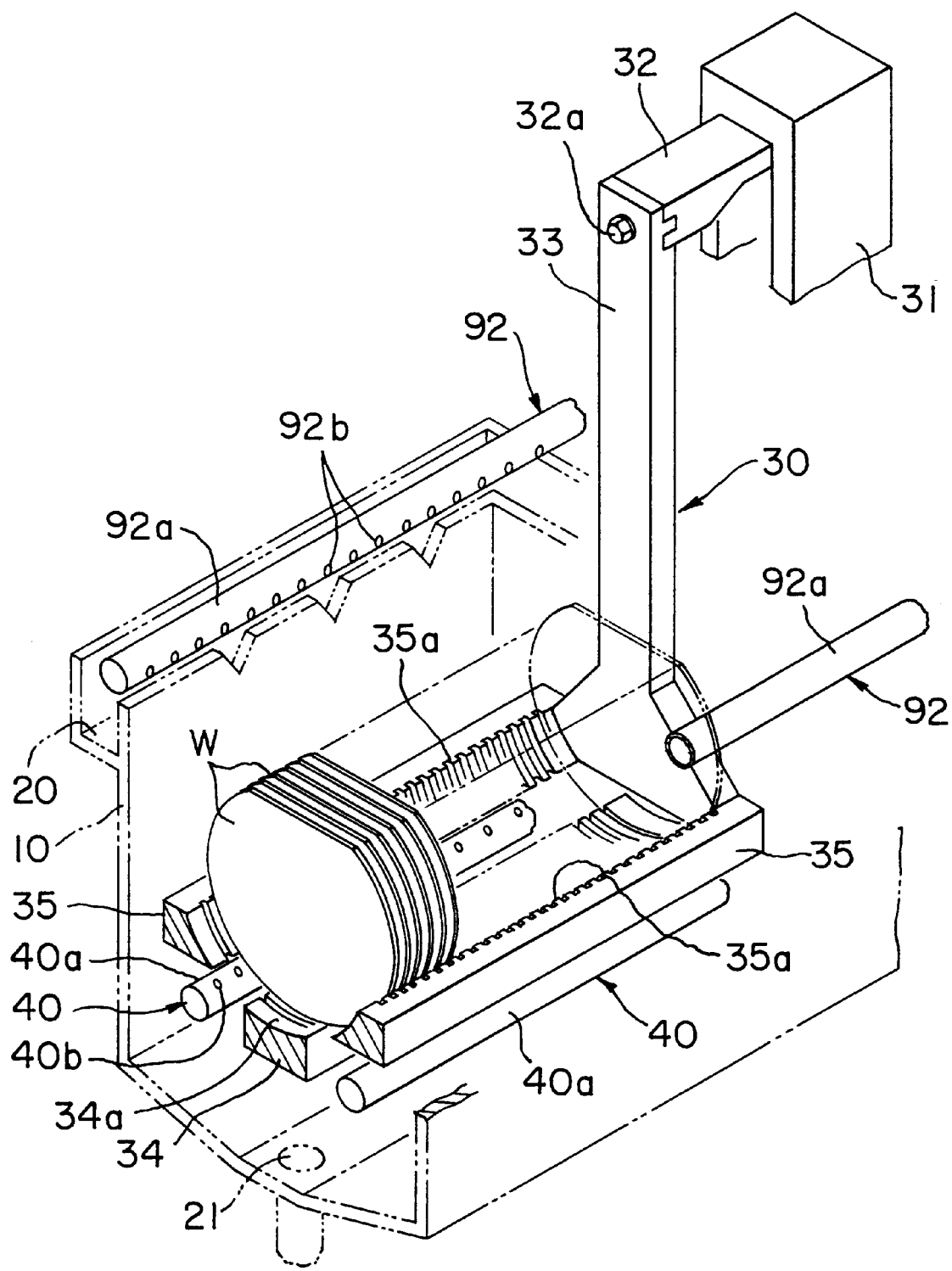
FIG. 15 is a perspective view of a means for holding objects to be processed in accordance with the third embodiment.

The shower nozzle pipes 92 are connected by an on/off valve 95 to a pure water supply pipeline 102 of the factory and are disposed in an upper portion of the treatment bath 10, symmetrically on either side. Each of the shower nozzle pipes 92 is pierced along a lower side of a tubular main nozzle body 92a by a large number of wafer-washing nozzle orifices 92b at a suitable spacing on an inner wall side of the treatment bath, as shown in FIG. 15. The shower nozzle pipes 92 need not necessarily be positioned above the treatment bath 10, as shown in the figure, but they could equally well be moved downward.

The wafers W can be pre-washed by the supply of pure water 1 that is jetted from the thus-configured shower nozzle pipes 92 and the jet nozzle pipes 40 towards the wafers W, then the water within the pure water tank 91 can be supplied rapidly into the treatment bath 10 and the outer bath 20 from the supply nozzle 99.

Figure 16:
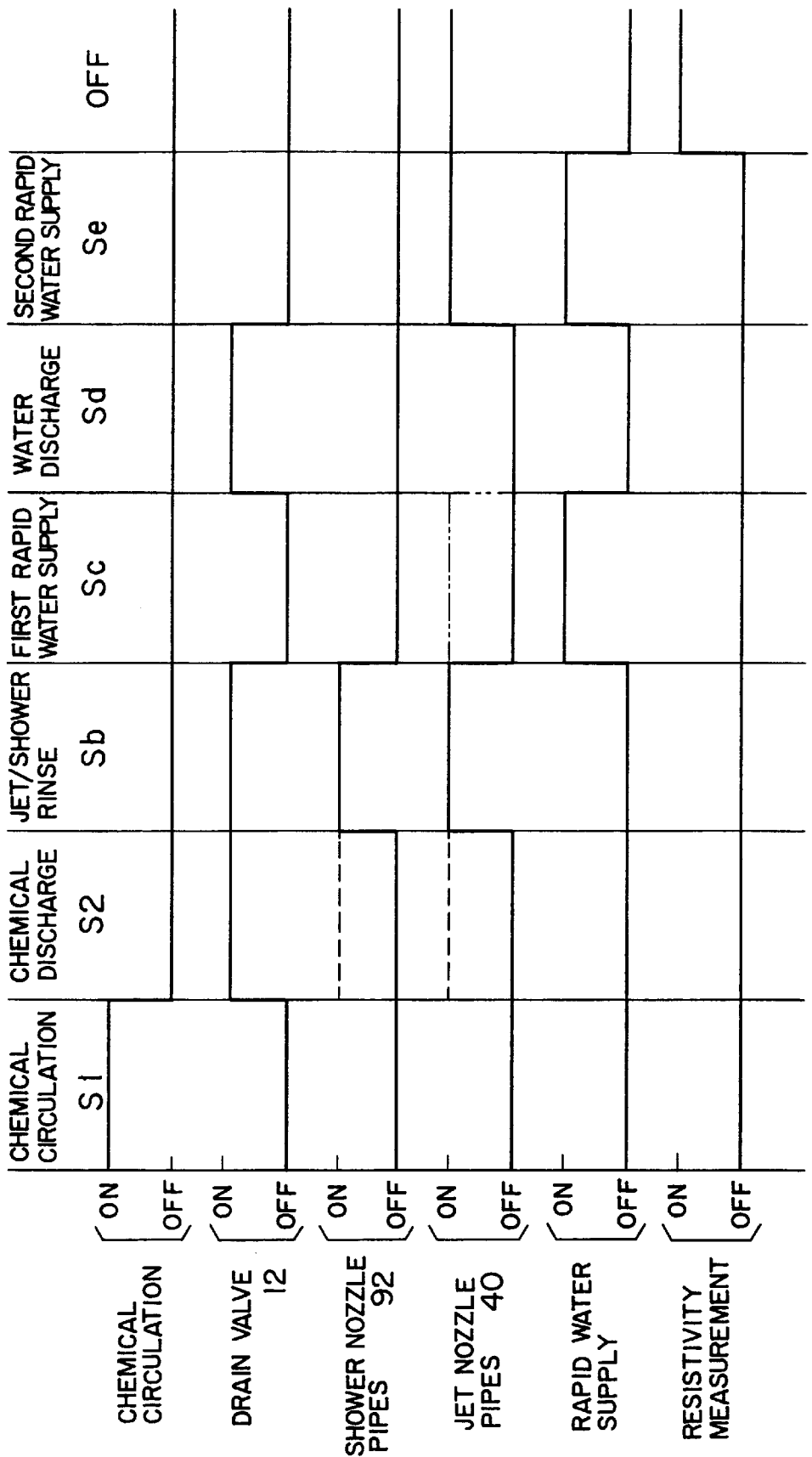
FIG. 16 is a timing chart illustrating the washing steps of the third embodiment.
Figure 17:
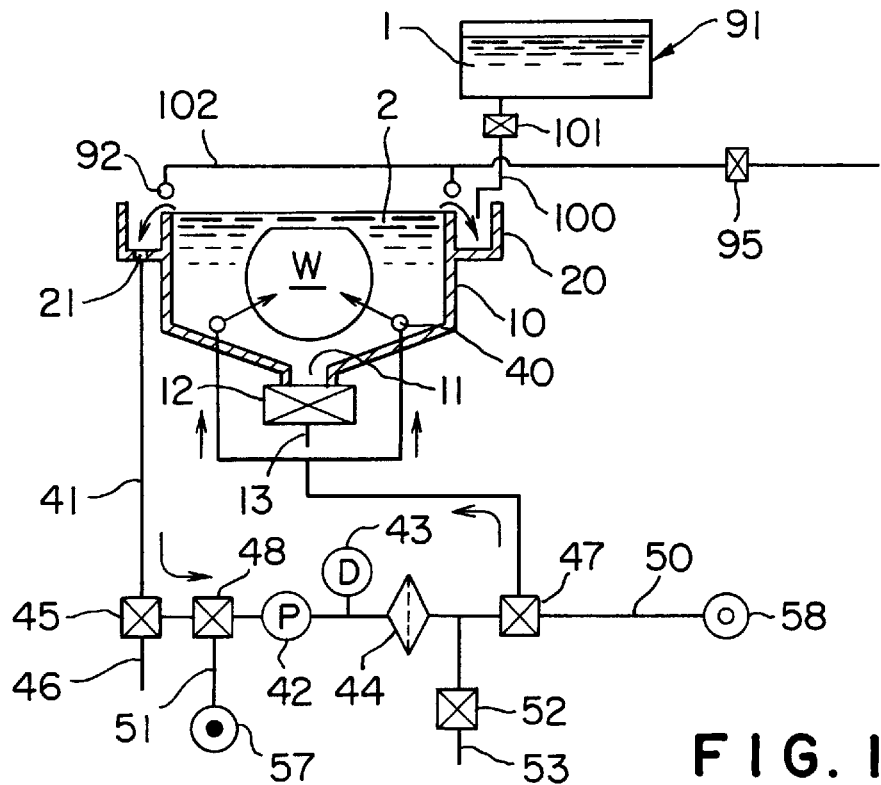
FIG. 17 is a schematic diagram illustrative of a chemical treatment step of the third embodiment.

The procedure with which the wafers W are subjected to a chemical treatment and are then washed in the liquid treatment apparatus of this third embodiment will now be described with reference to the timing chart of FIG. 16 and the schematic views of FIGS. 17 to 22. First of all, a plurality of wafers W, such as 50 wafers, that are conveyed by a wafer chuck (not shown in the figures) are placed in the wafer boat 30 and disposed in the treatment bath 10, as shown in FIG. 17. A chemical 2 that is a processing liquid such as ammonia, hydrochloric acid, or hydrofluoric acid is then supplied from the chemical supply source 57 into the treatment bath 10 and the chemical 2 is made to overflow from the treatment bath 10. The overflowing chemical 2 is jetted towards the wafers W from the jet nozzle pipes 40, by the driving of the pump 42 of the circulation pipeline 41, to remove any particles, metal ions, or oxide films adhering to the surfaces of the wafers W. This is a chemical circulation step S1 in FIG. 16.

Figure 18:
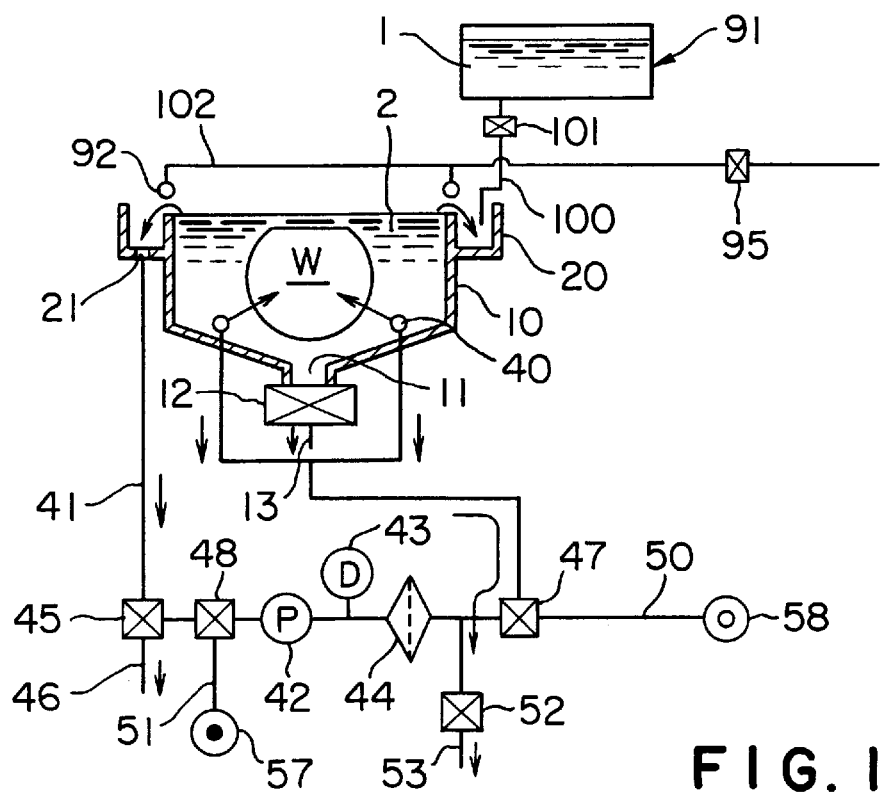
FIG. 18 is a schematic diagram illustrative of a chemical discharge step of the third embodiment.

After the chemical treatment has continued for a predetermined time, the circulation and supply of the chemical 2 is halted, the chemical 2 within the treatment bath 10 is discharged from the drain pipe 13 connected to the waste liquid port 11, as shown in FIG. 18, and the chemical within the circulation pipeline 41 is also discharged from the drain pipes 46 and 53. This is a chemical discharge step S2 in FIG. 16.

Figure 19:
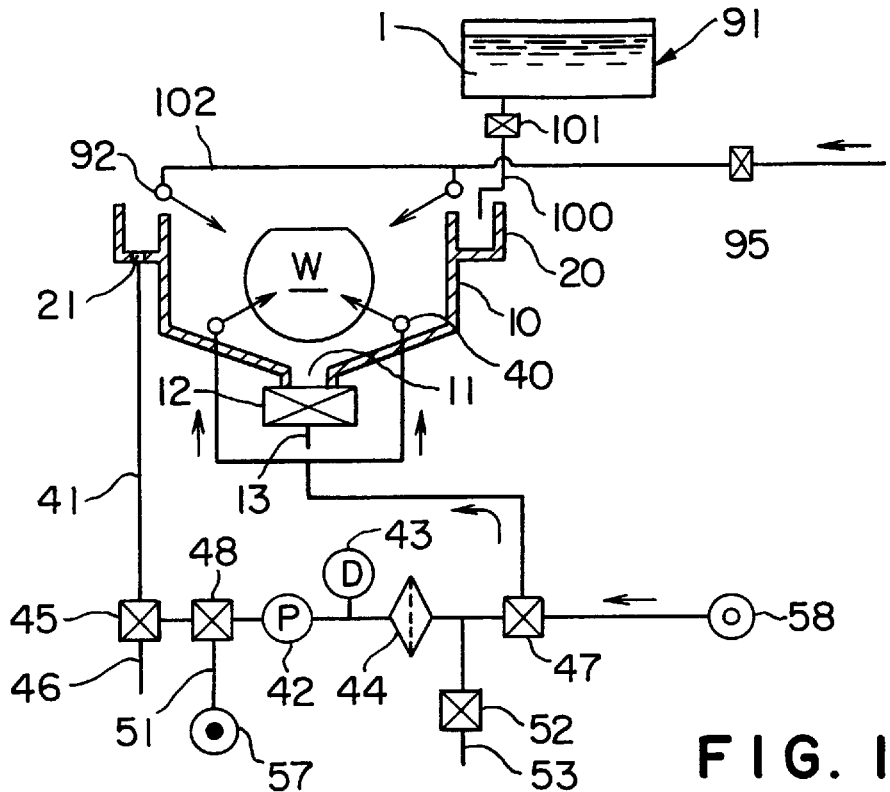
FIG. 19 is a schematic diagram illustrative of a jet/shower rinse step of the third embodiment.

The pump 42 is then stopped, as shown in FIG. 19, and the switching valve 47 is switched over so that pure water 1 supplied from the pure water supply source 58 is jetted towards the wafers W from the nozzle orifices of the jet nozzle pipes 40, to wash the wafers W. In addition, the on/off valve 95 is operated to supply pure water 1 from the factory's pure water line in a shower form from the shower nozzle pipes 92 towards the wafers W, to remove any remaining chemicals that are adhering to the wafers W. This is a preliminary washing step that is a jet/shower rinse step Sb in FIG. 16. Note that this preliminary washing could be performed during the chemical discharge.

Figure 20:
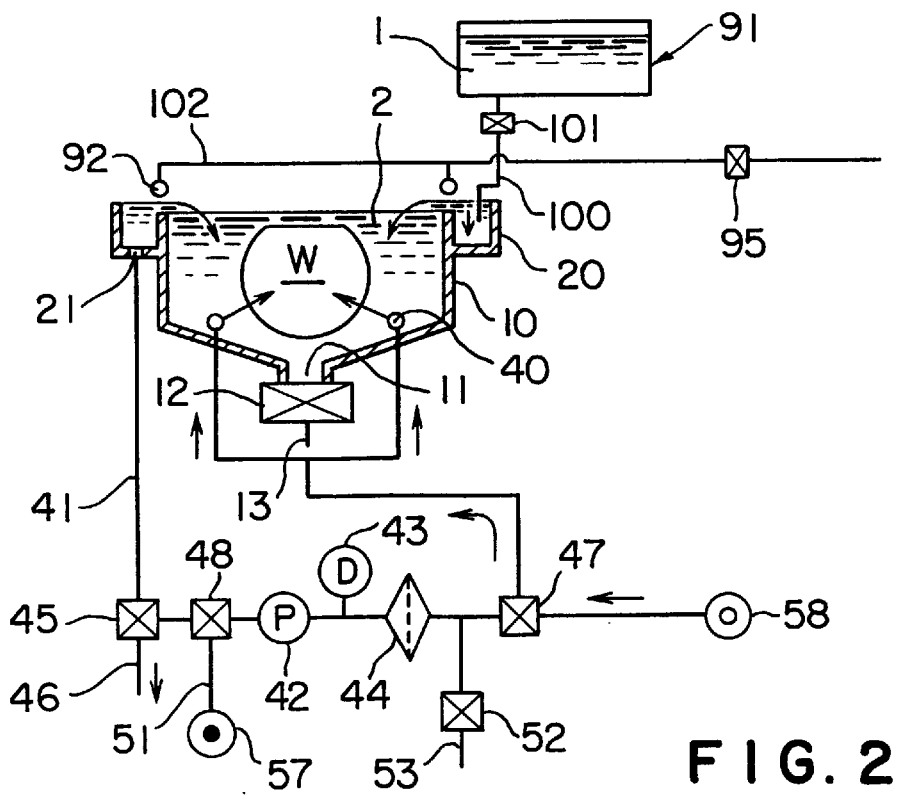
FIG. 20 is a schematic diagram illustrative of a first rapid-supply step of the third embodiment.
Figure 21:
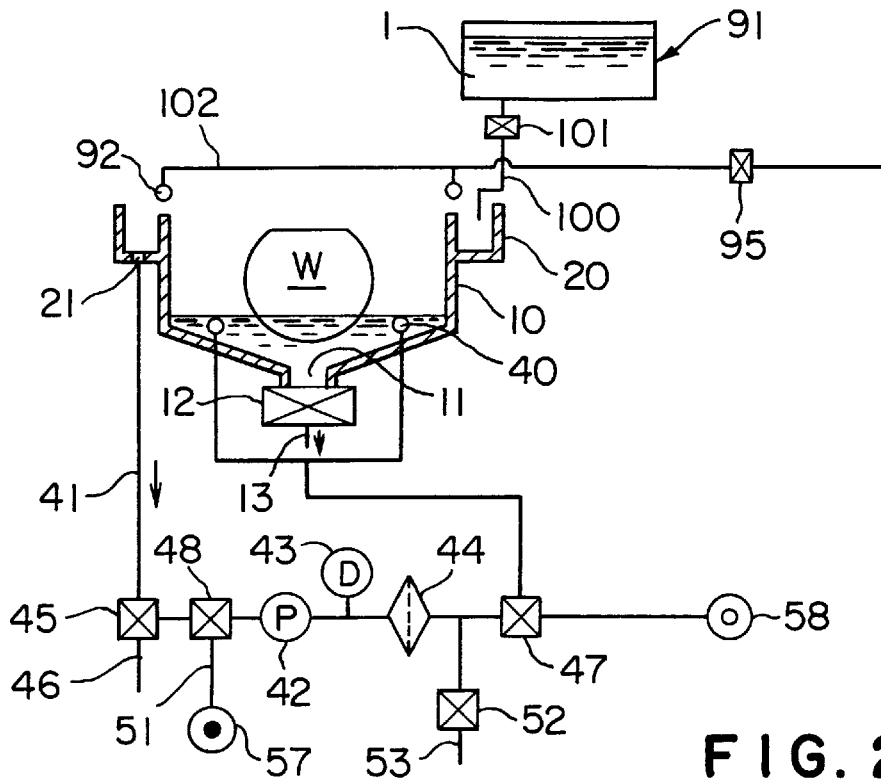
FIG. 21 is a schematic diagram illustrative of a washing liquid discharge step of the third embodiment.
Figure 22:
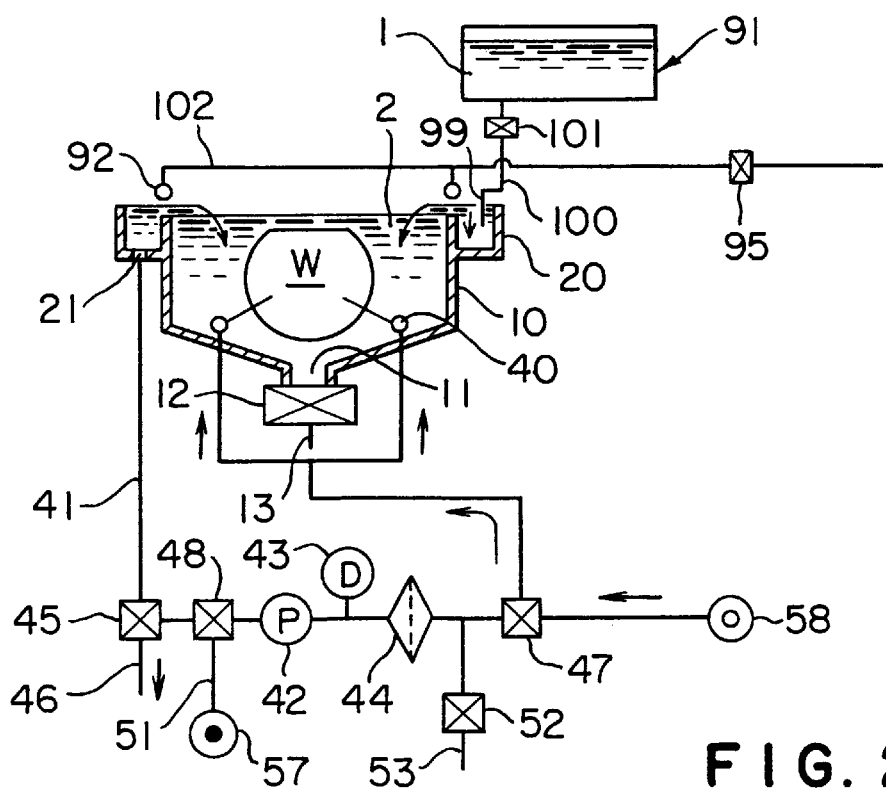
FIG. 22 is a schematic diagram illustrative of a second rapid-supply step of the third embodiment.

The on/off valve 95 is then closed to halt the supply of water from the shower nozzle pipes 92, as shown in FIG. 20, the supply valve 101 is opened to supply water from the pure water tank 91 rapidly through the supply pipe 100 into the outer bath 20 or into the inner bath 10, the pure water 1 is supplied from the outer bath 20 into the treatment bath 10, and thus the wafers W are washed. This is a first rapid water supply step Sc in FIG. 16. During this time, the supply of pure water 1 from the jet nozzle pipes 40 could either be stopped, or the supply of water from the jet nozzle pipes 40 could be allowed to continue as shown by the dot-dot-dashed line in FIG. 16. Note that the supply of pure water 1 from the shower nozzle pipes 92 must be halted during this first rapid water supply step Sc. That is because the supply of pure water 1 in a shower form from the shower nozzle pipes 92 causes carbon dioxide ($CO_2$) to be entrained into the pure water 1 and mixed therewith, and the mixing of this $CO_2$ will lower the resistivity of the pure water 1 and thus a long time will be required for the predetermined resistivity to be reached.

After a predetermined quantity of the pure water 1 has been rapidly supplied this first time, the supply valve 101 is closed to halt the supply of the pure water 1 from the pure water tank 91 and also the drain valve 12 is opened and the switching valve 45 is switched over to drain away the pure water 1 from the treatment bath 10 and the outer bath 20. This is a water discharge step Sd in FIG. 16. In this case, if the pure water 1 was being supplied from the jet nozzle pipes 40, the switching valve 47 is now closed to halt the supply of pure water 1 from the jet nozzle pipes 40.

The supply valve 101 is again opened to supply the water in the pure water tank 91 rapidly from the supply nozzle 99 into the outer bath 20 or into the inner bath 10 a second time, so that the pure water 1 is supplied into the treatment bath 10. This is a second rapid water supply step Se in FIG. 16. During this time, the switching valve 47 is opened so that the pure water 1 that is supplied from the pure water supply source 58 is jetted from the jet nozzle pipes 40 and is made to overflow from the treatment bath 10 into the outer bath 20 to wash the wafers W.

After a predetermined quantity of the pure water 1 has been rapidly supplied a second time, the supply valve 101 is closed to halt the supply of the pure water 1 from the pure water tank 91, then the resistivity detector 15 (see FIG. 14) measures the resistivity of the pure water 1 within the treatment bath 10 and the wafers W are grasped by the wafer chuck (not shown in the figures) and are removed to the exterior when the pure water 1 within the treatment bath 10 has reached a predetermined resistivity.

Fourth Embodiment

Figure 23A:
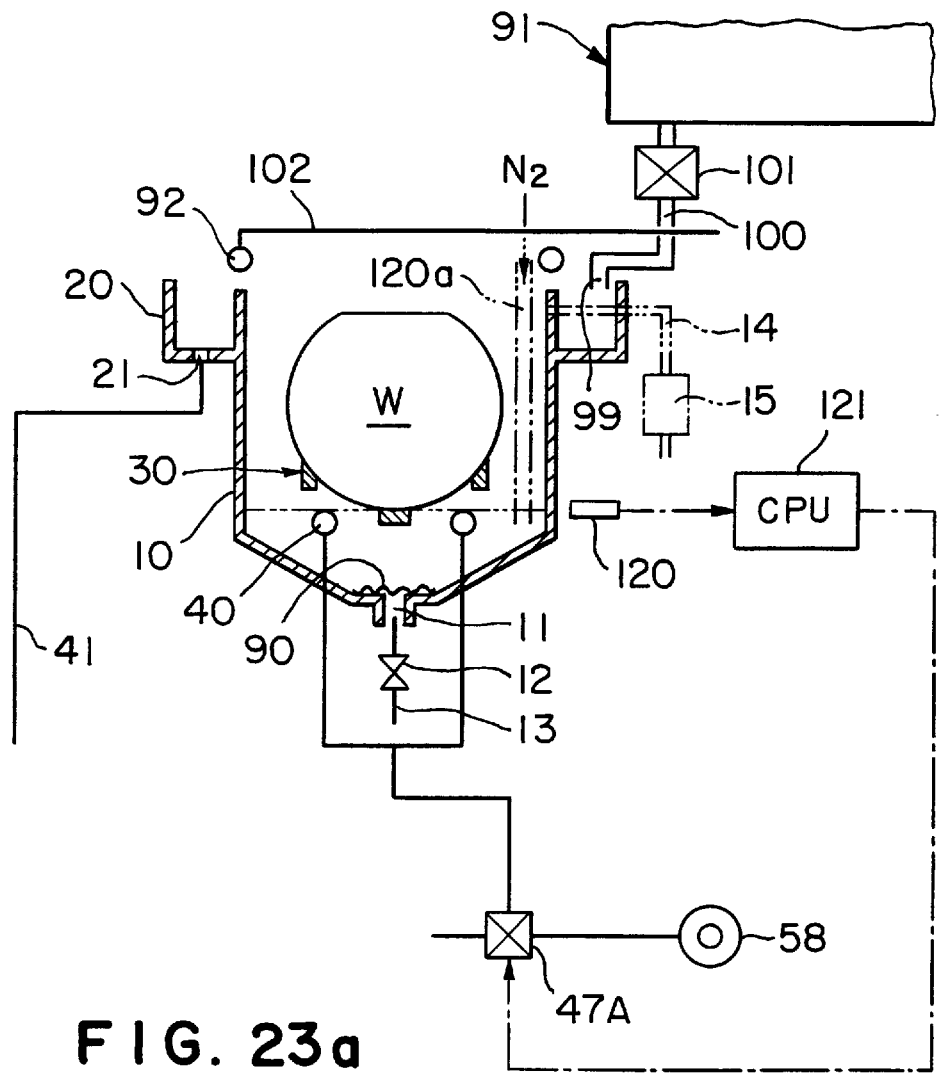
FIG. 23a is a schematic sectional view of a fourth embodiment of a liquid treatment apparatus in accordance with the present invention.

A fourth embodiment of a liquid treatment apparatus in accordance with this invention is shown in FIG. 23a. Components in FIG. 23a that are the same as those in FIG. 14 are given the same reference numbers and further description thereof is omitted.

In this fourth embodiment, the quantity of the pure water 1 jetted from the jet nozzle pipes 40 is adjusted so that water is prevented from splashing out of the treatment bath 10. In other words, a switching valve 47A interposed between the jet nozzle pipes 40 and the pure water supply source 58 is formed as a valve that is capable of switching between a small flow rate and a large flow rate. In addition, a liquid surface detection means such as a liquid surface sensor 120 is disposed on an outer portion of the treatment bath 10 close to a position at the height of the upper surfaces of the jet nozzle pipes 40, a signal detected by this liquid surface sensor 120 is sent to a control means such as a central processing unit (CPU) 121, and the switching valve 47A is operated (opened and closed) on the basis of control signals from the CPU 121 so that the operation is switched to either a small flow rate or a large flow rate. Note that a small flow rate in this case means any flow rate within a range at which the pure water 1 jetted from the jet nozzle pipes 40 does not splash out of the treatment bath 10, but it is preferable that this small flow rate is as large as possible within that range at which water does not splash out of the treatment bath 10.

Figure 24:
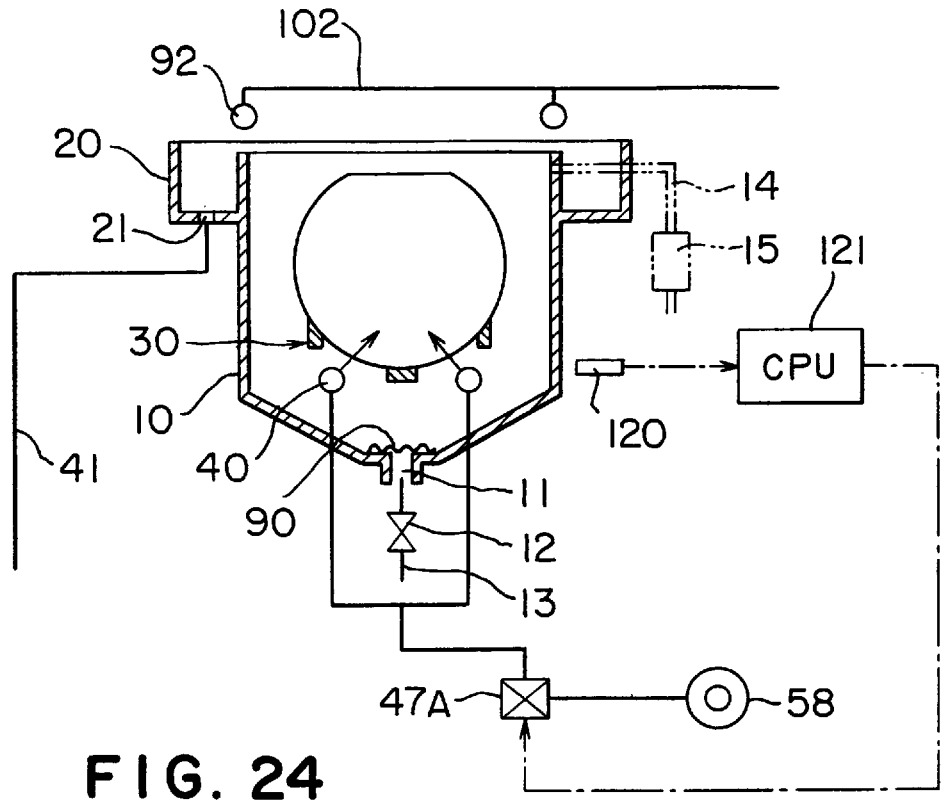
FIGS. 24 and 25 are schematic sectional views illustrative of first and second jet rinse steps of the fourth embodiment.
Figure 25:
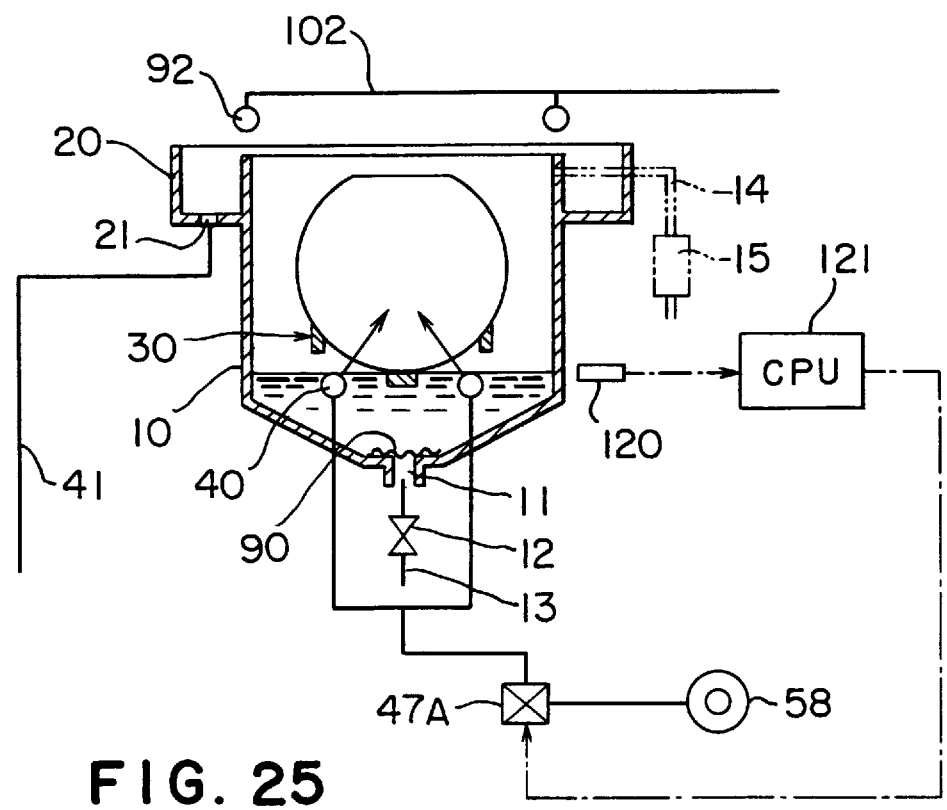

With this configuration, when it comes to jetting the water supplied from the pure water supply source 58 from the jet nozzle pipes 40 towards the wafers W after the chemical treatment has been performed and the chemical has been discharged, as previously described, the switching valve 47A is first switched to the operating position for a small flow rate and the pure water 1 jets from the nozzle orifices of the jet nozzle pipes 40 (see FIG. 24). In this state, the pure water 1 jetting from the jet nozzle pipes 40 is supplied towards the wafers W within the treatment bath 10, without splashing out of the treatment bath 10, to perform a washing operation (jet rinse) of the wafers W. The pure water 1 accumulates within the treatment bath 10, as shown in FIG. 25, and, when the liquid surface reaches as far as the tops of the jet nozzle pipes 40, that liquid surface is detected by the liquid surface sensor 120, a detection signal is transferred to the CPU 121, and the CPU 121 performs a comparison with previously stored information. The switching valve 47A is switched by a control signal from the CPU 121 so that pure water 1 at a large flow rate is jetted from the nozzle orifices of the jet nozzle pipes 40, and thus the pure water 1 can be supplied safely and rapidly into the treatment bath 10.

There is therefore no need to provide a separate supply line, making it convenient from both the space point of view and the cost point of view, and the pure water 1 can be prevented from splashing out of the treatment bath 10. Moreover, since the liquid surface of the pure water 1 within the treatment bath 10 is controlled by the liquid surface sensor 120, the flow rate of the pure water 1 can be switched at the optimal point and thus it is possible to increase the throughput.

Figure 23B:
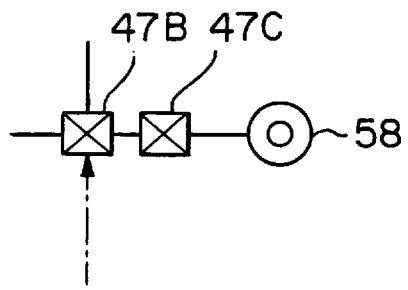
Figure 23C:
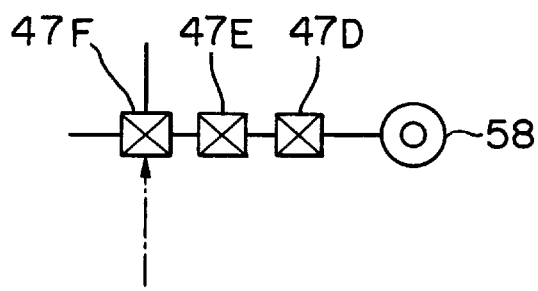

Note that the liquid surface detection means is configured by the liquid surface sensor 120 in the above described embodiment, but the liquid surface detection means need not necessarily be a liquid surface sensor. A gas such as $N_2$ could be supplied into a detector tube 120a inserted vertically into the treatment bath 10, as shown by the vertical dot-dot-dashed lines in FIG. 23a by way of example, and a detector means that detects the liquid surface by the pressurized state of that gas could be used. Alternatively, the management could be done in accordance with the time taken until the jet nozzle pipes 40 are submerged in the washing liquid, with is previously measured and stored. The above description also concerned a case in which the switching valve 47A was configured of an on/off valve that is capable of switching between a small flow rate and a large flow rate, but the apparatus could equally well be provided with a valve mechanism in which a switching valve 47B that is capable of switching between a small flow rate and a large flow rate is connected in series with an on/of f valve 47C, as shown in FIG. 23b. Alternatively, the valve mechanism could be a large-flow-rate on/off valve 47D, a switching valve 47E that is provided with a water-saving function for switching between a large flow rate and a water-saving rate, and a valve 47F that is capable of switching between a small flow rate and a large flow rate, all connected in series as shown in FIG. 23C.

In this manner, the flow rate of washing liquid into the treatment bath 10 can be switched while it is being supplied, but this principle can also be applied to the supply of chemical, that is, the processing liquid, into the treatment bath 10. In other words, it is possible to make the quantity of processing liquid that is supplied small during the initial stage in which the processing liquid is being jetted into the treatment bath 10 from the jet nozzle pipes 40, then increase it after the surface of the processing liquid has reached a level at which the jet nozzle pipes 40 are submerged.

Fifth Embodiment

Figure 26:
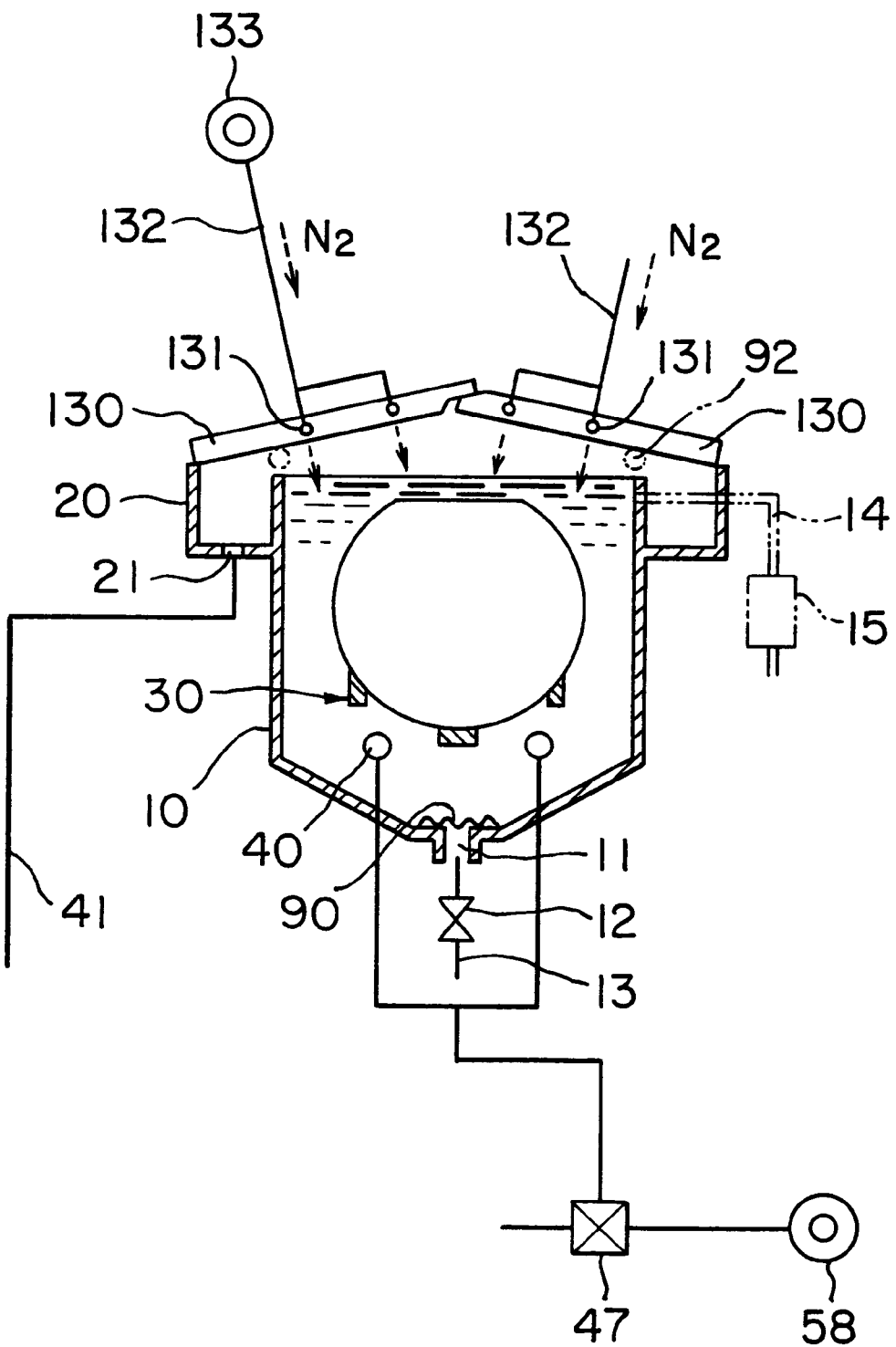
FIG. 26 is a schematic sectional view of a fifth embodiment.
Figure 27:
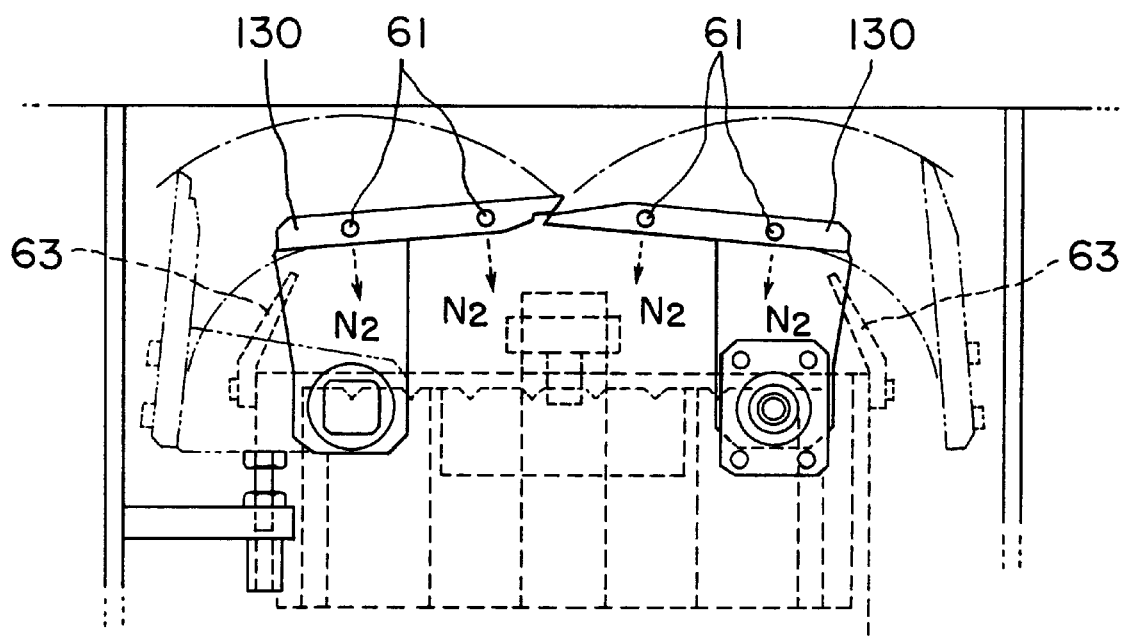
FIG. 27 is a side view of essential components of the fifth embodiment.

A fifth embodiment of the liquid treatment apparatus in accordance with this invention is shown in FIG. 26 and a lateral view of essential components thereof is shown in FIG. 27.

This fifth embodiment is designed to prevent the mixing of $CO_2$ into the pure water 1 used in the washing step, which would make the resistivity of the pure water 1 fall, thus preventing wasteful consumption of the water and also increasing the washing efficiency. In other words, the mixing of $CO_2$ into the pure water 1 is controlled in this embodiment by sealing the open portions of the treatment bath 10 and the outer bath 20 during at least the previously described jet/shower rinse step Sb of FIG. 16, then supplying an inert gas such as $N_2$ into the treatment bath 10.

In this case, a pair of lid members 130, which open and close about hinges on either side, are attached to the open portions of the treatment bath 10 and the outer bath 20, and $N_2$ supply nozzles 131 are disposed in each of these lid members 130, extending in a forked configuration from one side to the other, as shown in FIGS. 28 and 29. A large number of jet orifices (not shown in the figures) are provided at a suitable spacing below the $N_2$ supply nozzles 131, that is, facing the treatment bath when the lid members are closed, and an $N_2$ supply pipe 132 that is connected to an $N_2$ supply source 133 (see FIG. 26) is connected to an end portion thereof.

With this configuration, if the lid members 130 are closed during the rinse step and $N_2$ is supplied from the $N_2$ supply source 133 through the nozzle orifices of the $N_2$ supply nozzles 131 into the treatment bath 10, the $CO_2$ in the environment at the top of the treatment bath 10 is replaced with $N_2$, thus preventing $CO_2$ from dissolving into the pure water 1. Therefore, the fall in resistivity of the pure water 1 can be controlled, thus making it possible to reduce the amount of water consumed and also increase the washing efficiency. At the same time, the formation of natural oxide films on the wafers W, due to the inclusion of oxygen ($O_2$), is prevented. Note that when the treatment bath 10 and the lid members 130 are not in a sealed state, the attachment of fixed covers 63 along the sides of the treatment bath 10 is more effective in increasing the sealability between the lid members 130 and the treatment bath 10.

Further Embodiments

The liquid treatment apparatuses configured as described above in accordance with the third, fourth, and fifth embodiments can be used as independent chemical/washing treatment apparatuses, but they can also be used incorporated into wafer washing/drying systems. Such a wafer washing/drying system has already been described with reference to FIG. 13.

What is claimed is:

1. A liquid treatment apparatus comprising:
    processing liquid supply means for supplying a processing liquid, to cause said processing liquid to be brought into contact with an object to be processed said processing liquid supply means including a horizontally oriented jet nozzle pipe which has a drain portion at an end thereof; and
    washing fluid supply means for supplying a washing fluid, to cause said washing fluid to be brought into contact with said object to be processed, said washing fluid supply means having a downstream side connected to said processing liquid supply means to cause said washing fluid to be supplied through said process liquid supply means to come into contact with said object to be processed.

2. A liquid treatment apparatus as defined in claim 1, wherein said washing fluid supply means is connected to a washing liquid supply source by a pathway switching means.

3. A liquid treatment apparatus as defined in claim 1, wherein said washing fluid supply means is connected to a washing gas supply source by a pathway switching means.

4. A liquid treatment apparatus as defined in claim 1, wherein said jet nozzle pipe has a bottom surface inclined so as to slope downward from a processing liquid supply side thereof toward said drain portion.

5. A liquid treatment apparatus as defined in claim 1, wherein said jet nozzle pipe is positioned below or sidewise of said object to be processed and has an nozzle orifice that is directed towards said object to be processed.

6. A liquid treatment apparatus as defined in claim 1, further comprising a second washing fluid supply means positioned above said object to be processed, for supplying washing fluid from above towards said object to be processed.

7. A liquid treatment apparatus as defined in claim 1, further comprising a washing fluid tank positioned above said object to be processed, and a washing fluid supply pipe for supplying a washing fluid from said tank rapidly to said object to be processed by the force of gravity or by pressurizing means.

8. A liquid treatment apparatus as defined in claim 1, further comprising means for adjusting the flow rate of a washing fluid in liquid form, which is provided in said washing fluid supply means, and control means for controlling said flow-rate adjustment means in accordance with the liquid surface of the thus supplied washing fluid.

9. A liquid treatment apparatus as defined in claim 1, further comprising a treatment bath for accommodating said object to be processed, a lid member for opening and closing said treatment bath, and means for supplying an inert gas into said treatment bath.

10. A liquid treatment apparatus as defined in claim 1, further comprising a treatment bath for accommodating said object to be processed, and an outer bath for receiving treatment liquid and washing fluid that are poured into said treatment bath and overflow from said treatment bath.

11. A liquid treatment apparatus comprising:
    a treatment vessel;
    processing liquid supply means for supplying a processing liquid into said treatment vessel, to cause said processing liquid to be brought into contact with an object to be processed, placed within said treatment vessel;
    washing liquid supply means for supplying a washing liquid, to cause said washing liquid to be brought into contact with said object to be processed, said washing liquid supply means having a downstream side connected to said processing liquid supply means to cause said washing liquid to be supplied through said processing liquid supply means to come into contact with said object to be processed;
    flow rate switching means provided in at least one of said processing liquid supply means and said washing liquid supply means to change a flow rate of the liquid;
    sensor means for detecting a liquid supplied within said treatment vessel; and
    control means for controlling said flow rate switching means to change the flow rate of the liquid in accordance with the liquid level detected by said sensor means.

12. A liquid treatment apparatus as defined in claim 11, wherein said flow rate switching means includes a switching valve for switching between a smaller flow rate and a larger flow rate, and said control means is operative to switch said switching valve from the smaller flow rate to the larger flow rate when said sensor means detects a predetermined liquid level within the treatment vessel.

13. A liquid treatment apparatus as defined in claim 12, wherein said smaller flow rate of the liquid is such that splashing of the liquid supplied into the treatment vessel does not occur.

14. A liquid treatment apparatus as defined in claim 12, wherein the treatment vessel is provided with a jet nozzle pipe for jetting the liquid into the treatment vessel, said smaller flow rate is such that splashing of the liquid supplied into the treatment vessel does not occur, and said predetermined liquid level is a level above said jet nozzle pipe.

15. A liquid treatment apparatus as defined in claim 11, wherein said sensor means includes a detector tube extending downward into said treatment vessel and having an open lower end located at a predetermined level within the treatment vessel, an inert gas being supplied through said detector tube to flow out into the treatment vessel through said open lower end.

16. A liquid treatment apparatus as defined in claim 11, wherein said sensor means includes a timer for counting a time by when a predetermined liquid level is reached within the treatment vessel.

17. A liquid treatment apparatus comprising:
    a treatment vessel having a bottom;
    processing liquid supply nozzles provided within said treatment vessel, for supplying a processing liquid into said treatment vessel, to cause said processing liquid to be brought into contact with an object to be processed, placed within said treatment vessel, and to thus carry out a processing on said object;
    said treatment vessel having a top overflow opening over which the processing liquid that has been supplied into and has filled said vessel overflows, said object within said vessel being thus dipped in the processing liquid filling the vessel;
    a waste liquid port provided in said bottom of the treatment vessel to allow a waste liquid within said vessel to be discharged through said port;
    washing liquid supply means for ejecting a washing liquid against said object which has been subjected to said processing while being dipped in the processing liquid, said washing liquid supply means having a downstream side connected to said processing liquid supply nozzles to cause said washing liquid to be supplied through said processing liquid supply nozzles to be ejected against said object to be processed;

a lid provided over said top overflow opening of the treatment vessel for opening and closing the treatment vessel, said lid cooperating with the treatment vessel to define a closed space over said overflow opening of the treatment vessel when the lid closes the treatment vessel; and means for supplying an inert gas into said closed space of the treatment vessel with said lid member closing the treatment vessel, to thereby replace an atmosphere including carbon dioxide in said closed space with the inert gas supplied.

18. A liquid treatment apparatus as defined in claim 17, wherein said means for supplying an inert gas into the treatment vessel is provided in said lid member.

19. A liquid treatment apparatus as defined in claim 18, wherein said means for supplying an inert gas comprises inert gas supply nozzle pipes (131) provided in said lid and having inert gas supply nozzles directed toward the treatment vessel when the lid is closed.

20. A liquid treatment apparatus as defined in claim 19, wherein said lid comprises a pair of opposite lid sections hinged along opposite side edges of the overflow opening of the vessel, respectively, in a manner swingable between open positions and closing positions, said inert gas supply nozzle pipes extending in a direction parallel to said side edges of the treatment vessel.

21. A liquid treatment apparatus as defined in claim 17, further comprising an outer vessel provided around said treatment vessel for receiving the processing liquid and the washing liquid which are supplied into the treatment vessel and overflow from the treatment vessel, said lid being provided for opening and closing the outer vessel.

22. A liquid treatment apparatus as defined in claim 17, further comprising shower nozzle pipes (92) provided above said overflow opening of the treatment vessel to supply a further washing liquid downward into the treatment vessel.

23. A liquid treatment apparatus as defined in claim 17, wherein said top overflow opening contains at least one V shaped verturi slit for controlling flow between said treatment bath and said overflow bath.

* * * * *